(12) United States Patent
Kijima

(10) Patent No.: US 9,099,681 B2
(45) Date of Patent: Aug. 4, 2015

(54) DISPLAY DEVICE, DISPLAY, AND ELECTRONIC UNIT

(75) Inventor: Yasunori Kijima, Tokyo (JP)

(73) Assignee: JOLED INC. (JP)

( * ) Notice: Subject to any disclaimer, the term of this patent is extended or adjusted under 35 U.S.C. 154(b) by 499 days.

(21) Appl. No.: 13/445,652

(22) Filed: Apr. 12, 2012

(65) Prior Publication Data

US 2012/0286300 A1 Nov. 15, 2012

(30) Foreign Application Priority Data

May 13, 2011 (JP) .................................. 2011-108213

(51) Int. Cl.
*H01L 29/18* (2006.01)
*H01L 33/00* (2010.01)
*H01L 51/52* (2006.01)

(52) U.S. Cl.
CPC ......... *H01L 51/5275* (2013.01); *H01L 51/5265* (2013.01); *H01L 51/5278* (2013.01); *H01L 2251/5323* (2013.01); *H01L 2251/558* (2013.01)

(58) Field of Classification Search
USPC .......... 257/40, 103, 88; 313/503, 504; 438/99
See application file for complete search history.

(56) References Cited

U.S. PATENT DOCUMENTS

| 2006/0261727 | A1* | 11/2006 | Aziz et al. ...................... 313/503 |
| 2007/0111029 | A1* | 5/2007 | Yamada et al. ............... 428/690 |
| 2007/0241663 | A1* | 10/2007 | Huang et al. .................. 313/503 |
| 2012/0119194 | A1* | 5/2012 | Nagai et al. ..................... 257/40 |

FOREIGN PATENT DOCUMENTS

| JP | 2005-310469 | 11/2005 |
| JP | 2006-165034 | 6/2006 |

OTHER PUBLICATIONS

Song et al., "LTPS-based Transparent AM OLED," SID 10 Digest, pp. 144-147. (4 pages).
Chung et al., "Transparent AMOLED Display Based on Bottom Emission Structure," SID 10 Digest, pp. 148-151. (4 pages).
Park et al., "Oxide TFT Driving Transparent AM-OLED," SID 10 Digest, pp. 245-248, (4 pages).

* cited by examiner

*Primary Examiner* — Errol Fernandes
(74) *Attorney, Agent, or Firm* — Sheridan Ross P.C.

(57) ABSTRACT

A display device includes: a third electrode provided on a side of the second electrode opposite to the light-emitting layer; and an efficiency improving layer improving an efficiency of light extraction from the light-emitting layer, and the efficiency improving layer being provided between the second and third electrodes. The first and third electrodes are each in a laminated structure including a first layer being transmissive, and a second layer being transmissive and having a refractive index higher than a refractive index of the first layer.

18 Claims, 11 Drawing Sheets

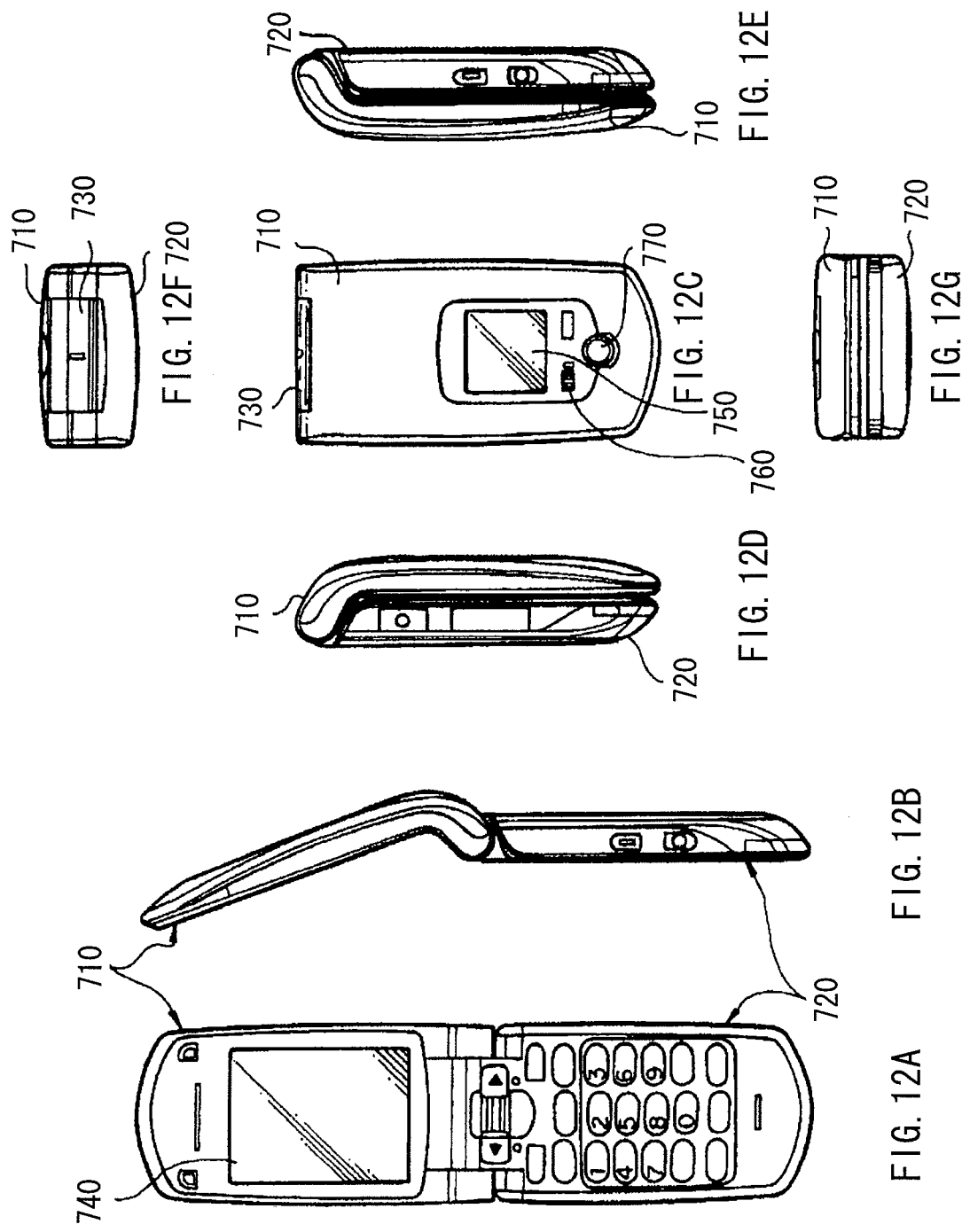

DISPLAY DEVICE, DISPLAY, AND ELECTRONIC UNIT

CROSS REFERENCES TO RELATED APPLICATIONS

The present application claims priority to Japanese Priority Patent Application JP 2011-108213 filed in the Japan Patent Office on May 13, 2011, the entire content of which is hereby incorporated by reference.

BACKGROUND

The present disclosure relates to a display device emitting light using a phenomenon of organic EL (Electro Luminescence) and being transmissive, and a display and an electronic unit provided with the display device.

An organic electroluminescent display device has been receiving attention as a promising candidate for a next-generation display device, and is recently receiving attention also as a possible application for a transparent display.

The transparent display is a promising device of offering a new world with a sense of unity between Augmented Reality (AR), in other words, the in-screen world, and another world visible through the screen. Such a transparent display has been under active technology development (for example, see Non-Patent Literature 1 (Young Woo Song, Sansung SDI, Yongin, Korea, SID 10 DIGEST, 144-147), Non-Patent Literature 2 (Jinkoo Chung, Samsung Mobile Display, Yongin, Korea, SID 10 DIGEST, 148-151), and Non-Patent Literature 3 (Sang-Hee Park, ETRI, Daejeon, Korea, SID 10 DIGEST, 245-248)). As an exemplary AR technology, Non-Patent Literature 1 describes the approach of improving the transmittance of a panel itself, for example. To be specific, the transmittance of the entire panel is increased in the previous approach by, in a pixel 100 including light-emitting regions 101 and drive circuits 102 over the entire surface thereof as shown in FIG. 14A, reducing the size of the light-emitting regions 101 to provide an empty transparent region 103 as shown in FIG. 14B, for example.

The concern about the transparent display is to ensure the viewability thereof (for example, to increase the contrast thereof) as being transparent. To get around the disadvantage as such, a popular approach is to concentrate luminous fluxes toward the front while ensuring a certain level of light transmission property for display by utilizing the strong cavity effect using a semi-transmissive metal film, for example. However, with the resulting transparent display manufactured by the method as above, light of the display section hardly reaches the rear surface side of the panel. Therefore, the side in one direction (the side of the front surface) is indeed transmissive, but the rear surface side is like a mirror with the extremely poor viewability including display. Such a transparent display is thus hardly transparent.

Moreover, with the transparent display structured as described above, since the viewability is ensured by using the strong cavity effect, the viewing angle dependence of chromaticity and that of luminance are both high even on the front surface side with the good viewability. This thus results in a disadvantage of failing to fully utilize the excellent points of the transparent display that is supposed to allow viewing of the same display screen no matter from which direction.

To get around such a disadvantage, in Japanese Unexamined Patent Application Publication No. 2006-165034, for example, proposed is an organic EL device improved in light extraction efficiency with a reduced color tone difference of emitted light between a pair of transparent electrode sides. This proposal is made by defining the length of cavity between the transparent electrodes on both surfaces and the light-emitting position. This organic EL device allows light extraction from both sides of first and second transparent buffer regions, which are provided outside of the transparent electrodes, respectively. Between these transparent electrodes, provided is an organic layer including a light-emitting layer. To be specific, in the organic EL device, the refractive index step is set to be about 0.6 or smaller in any boundary surfaces existing at positions where the distance from the light-emitting interface of the light-emitting layer is smaller than the coherence length Lc, which is calculated by PL (PhotoLuminescence) spectrum of light coming from the light-emitting interface.

In Japanese Unexamined Patent Application Publication No. 2005-310469, proposed is the approach to improve the efficiency of light emission through improvement of adhesion by processing the interface between a transparent electrode formed on the surface opposite to the substrate and an organic layer using a silane coupling agent.

SUMMARY

With the structure proposed in Japanese Unexamined Patent Application Publication No. 2006-165034, however, the actual structure is of strong cavity. Therefore, the resulting light transmission property is not enough in both directions, and there is also a disadvantage of complicating the structure in terms of changing the total film thickness of the organic layer structured by wavelengths of emission. Moreover, with the method described in Japanese Unexamined Patent Application Publication No. 2005-310469, there is a disadvantage of not ensuring the device characteristics because the transparent electrode is manufactured on an organic EL device after a series of processing, i.e., the organic EL device being solid is coated with a silane coupling agent being liquid, and the solvent is removed by a heating process.

It is thus desirable to provide a display device with which the efficiency of light emission is improved at the same time with reduced variation of transmittance in a visible light region, and a display and an electronic unit using the display device.

According to an embodiment of the present disclosure, there is provided a display device including one or more organic layers with a light-emitting layer between first and second electrodes both being transmissive. The display device includes a third electrode provided on a side of the second electrode opposite to the light-emitting layer; and an efficiency improving layer improving an efficiency of light extraction from the light-emitting layer, and the efficiency improving layer being provided between the second and third electrodes. The first and third electrodes are each in a laminated structure including a first layer being transmissive, and a second layer being transmissive and having a refractive index higher than a refractive index of the first layer.

According to an embodiment of the present disclosure, there is provided a display including a plurality of display devices, each of the display devices including: one or more organic layers with a light-emitting layer between a first electrode and a second electrode both being transmissive; a third electrode provided on a side of the second electrode opposite to the light-emitting layer; and an efficiency improving layer improving an efficiency of light extraction from the light-emitting layer, and the efficiency improving layer being provided between the second and third electrodes. The first and third electrodes are each in a laminated structure including a first layer being transmissive, and a second layer being transmissive and having a refractive index higher than a refractive index of the first layer.

According to an embodiment of the present disclosure, there is provided an electronic unit including a display provided with a plurality of display devices in a display section, each of the display devices including: one or more organic layers with a light-emitting layer between a first electrode and a second electrode both being transmissive; a third electrode provided on a side of the second electrode opposite to the light-emitting layer; and an efficiency improving layer improving an efficiency of light extraction from the light-emitting layer, and the efficiency improving layer being provided between the second and third electrodes. The first and third electrodes are each in a laminated structure including a first layer being transmissive, and a second layer being transmissive and having a refractive index higher than a refractive index of the first layer.

In the display device, and in the display and the electronic device including the display device according to the embodiments of the present disclosure, the third electrode is provided on the side of the second electrode opposite to the organic layer(s), and the efficiency improving layer is provided between the second and third electrodes. With a first electrode, the second electrode sandwiches therebetween one or more organic layers with a light-emitting layer. Moreover, the first and third electrodes are each in the two-layer structure including the first layer being transmissive, and the second layer being transmissive and having a refractive index higher than that of the first layer. With such a structure, the efficiency of light extraction is improved with a reduced strong cavity effect.

In the display device, and in the display and the electronic device including the display device according to the embodiments of the present disclosure, the first and third electrodes sandwich therebetween one or more light-emitting layers, the second electrode, and the efficiency improving layer in this order. The first and third electrodes are each in the two-layer structure including the transmissive first layer, and the transmissive second layer whose refractive index is higher than that of the first layer. This structure accordingly reduces the viewing angle dependence with a reduced strong cavity effect, and the transmittance of light to the first electrode side is ensured. What is more, with the provision of the efficiency improving layer between the second and third electrodes, the efficiency of light extraction to the front and rear surface sides is improved, and the emission of light emission is improved.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 12A is a front view of a unit in the open state in Application Example 5, FIG. 12B is a side view thereof, FIG. 12C is a front view thereof in the closed state, FIG. 12D is a left-side view thereof, FIG. 12E is a right-side view thereof, FIG. 12F is a top view thereof, and FIG. 12G is a bottom view thereof.

DETAILED DESCRIPTION

Embodiments of the present disclosure are described in detail in the following order by referring to the accompanying drawings.
[First Embodiment]
 1. Display Device
 2. Display
[Second Embodiment]
[Modification]
[Application Examples]
[Examples]

First Embodiment

1. Display Device

Figure 1:
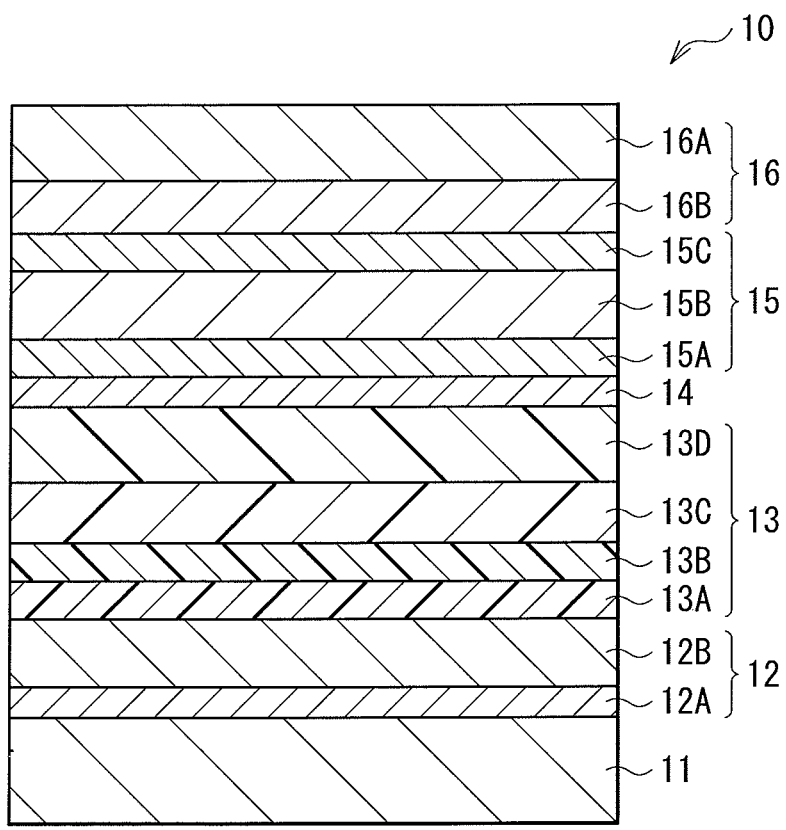
FIG. 1 is a cross-sectional view of a display device according to a first embodiment of the present disclosure.

FIG. 1 is a diagram showing the cross-sectional structure of a display device 10 according to a first embodiment of the present disclosure. The display device 10 is structured to include, on a substrate 11, an anode (first electrode) 12, an organic layer 13 including a light-emitting layer 13C, an intermediate electrode (second electrode) 14, an efficiency improving layer 15, and a cathode (third electrode) 16 in this order. In this embodiment, the anode 12 includes first and second layers 12A and 12B, which are disposed one on the other. The first layer 12A is transmissive, and the second layer 12B is also transmissive, and has a refractive index higher than that of the first layer 12A. The second layer 12B is provided on the organic layer 13 side. Similarly to the anode 12, the cathode 16 includes first and second layers 16A and 16B, which are disposed one on the other. The first layer 16A is transmissive, and the second layer 16B is also transmissive, and has a refractive index higher than that of the first layer 16A. The second layer 16B is provided on the organic layer 13 side. The efficiency improving layer 15 is in the three-layer structure, including first to third layers 15A to 15C in this order from the organic layer 13 side toward the cathode 16 side. The first layer 15A has a low refractive index, the second layer 15B has a refractive index higher than that of the first layer, and the third layer 15C has a refractive index lower than that of the second layer.

Such a display device 10 is of a transparent display type, extracting emitted light from the substrate 11 side and the cathode 16 side. The emitted light is generated at the time of recombination, in the light-emitting layer 13C, between positive holes injected from the anode 12 and electrons injected from the cathode 16.

The substrate 11 is a support body formed with an arrangement of a plurality of display devices 10 on one main surface side thereof. The substrate 11 in use may be of a known type, and is made of quartz or glass, or is a metal foil, or a resin film or sheet, for example. Among these, the substrate 11 is preferably made of quartz or glass, and when the substrate 11 is made of resin, the material includes methacrylate resin typified by poly methyl methacrylate (PMMA), polyester exemplified by polyethylene terephthalate (PET), polyethylene naphthalate (PEN), and polybutylene naphthalate (PBN), and polycarbonate resin, for example. With the substrate 11 made of resin, the substrate is expected to have the laminated structure or be subjected to surface treatment for suppression of water and gas permeability.

The anode 12 is in the structure of including the transmissive first layer 12A, and the transmissive second layer 12B whose refractive index is relatively higher than that of the first layer 12A in this order from the substrate 11 side. The thickness of the anode 12 in the laminating direction (hereinafter, simply referred to as thickness) is preferably 5 nm or more but 3000 nm or less.

For hole injection to the organic layer 13 with a good efficiency, the first layer 12A is preferably made of a material with a large work function from the vacuum level of an electrode material, and a material with the light transmission property, in other words, a material with a low absorption index of light. The specific material includes Indium Tin Oxide (ITO), Indium Zinc Oxide (InZnO), an alloy of zinc oxide (ZnO) and aluminum (Al), nickel oxide (NiO), and others. The anode 12 may be in the single-layer structure of a transparent conductive film made of such a material, or in the multi-layer structure including a plurality of layers. The first layer 12A is preferably low in light absorption at the same time having the ensured conductivity. Therefore, the thickness of the first layer 12A is preferably as thin as possible while realizing the sheet resistance for driving as a display. To be specific, the thickness of the first layer 12A is preferably 5 nm or more but 200 nm or less.

The second layer 12B has a refractive index higher than that of the first layer 12A, and is a transparent film containing one or more of niobium oxide (NbO), titanium oxide (TiO), molybdenum oxide (MoO), tantalum oxide (TaO), zirconium oxide (ZrO), Hafnium oxide (HfO), vanadium oxide (VO), tungsten oxide (WO), chromium oxide (CrO), zinc oxide (ZnO), and tin oxide (SnO), for example. Other than these materials, the second layer 12B may be also made of a mixture of NbO and TiO, a mixture of TiO and ZnO, or a mixture of silicon oxide (SiO) and Sn, for example. Also other than the materials described above, the second layer 12B may contain oxides of lanthanoide element or an oxide layer (including native oxide film) as a secondary component. Since the oxides of lanthanoide element have a high transmittance, containing such oxides improves the transmittance of the second layer 12B so that the transmittance of the entire display is retained high. Moreover, the thickness of the second layer 12B is preferably 3 nm or more but 100 nm or less. Herein, the oxidation number of the oxides described above is not restrictive, and any condition satisfying the transmittance and the refractive index may be arbitrarily selected as appropriate to the method and condition for film formation, for example.

When the display 1 structured using such a display device 10 is an active matrix display, the anode 12 is subjected to patterning on a pixel basis, and is connected to a thin film transistor (TFT; not shown) provided to the substrate 11 for driving use. In this structure, the anode 12 is provided thereon with a partition 17 (see FIG. 4), and the anode 12 of each pixel is so structured that the surface thereof is exposed from an aperture section of the partition 17.

The organic layer 13 is in the laminated structure of including, in order from the anode 12 side, a hole injection layer 13A, a hole transport layer 13B, a light-emitting layer 13C, and an electron transport layer 13D, for example. Although the details are given later, such an organic layer 13 is formed by vacuum deposition or spin coating, for example. The upper surface of the organic layer 13 is covered with the intermediate electrode 14. In the organic layer 13, these layers are not specifically restricted in terms of thickness, material, and others but an example is described below.

The hole injection layer 13A is a buffer layer for improving the efficiency of hole injection to the light-emitting layer 13C, and for preventing any leakage. The thickness of the hole injection layer 13A is preferably in a range from 5 nm to 200 nm, and more preferably, is in a range from 8 nm to 150 nm, for example. The material of the hole injection layer 13A may be arbitrarily selected considering the relationship with the material of electrodes or that of adjacent layers, and is exemplified by polyaniline, polythiophene, polypyrrole, polyphenylene vinylene, polythienylene vinylene, polyquinoline, polyquinoxaline, and derivatives thereof, conductive macromolecule such as polymers with the aromatic amine structure in the main or side chain, metal phthalocyanine (copper phthalocyanine, for example), carbon, and others. The specific example of the conductive polymers include oligo aniline, and polydioxythiophene such as poly(3,4-ethylenedioxythiophene) (PEDOT), for example.

The hole transport layer 13B is for improving the efficiency of hole transport to the light-emitting layer 13C. Depending on the entire structure of the device, the thickness of the hole transport layer 13B is preferably in a range from 5 nm to 200 nm, and more preferably, in a range from 8 nm to 150 nm, for example. The material structuring the hole transport layer 13B includes a light-emitting material soluble in an organic solvent, exemplified by polyvinyl carbazole, polyfluorene, polyaniline, polysilane, or derivatives thereof, polysiloxane derivatives with the aromatic amine structure in the main or side chain, polythiophene and derivatives thereof, and polypyrrole or Alq3.

In the light-emitting layer 13C, with the application of an electric field, light emission occurs by recombination between electrons and positive holes. Depending on the entire structure of the device, the thickness of the light-emitting layer 13C is preferably in a range from 10 nm to 200 nm, and more preferably, in a range from 20 nm to 150 nm, for example. The light-emitting layer 13C may be in the single-layer structure or in the multi-layer structure, and may be a white light-emitting display device in the laminated structure of red, green, and blue light-emitting layers, for example. As for these light-emitting layers, the colors of emission are not restricted to red, green, and blue, and may be orange, for example. Also with a light-emitting layer of orange, a white light-emitting display device is structured using a light-emitting layer of blue green for lamination.

The light-emitting layer 13C may be made of a material each appropriate to the color of emission, and the material includes polyfluorene polymer derivatives, (poly)paraphenylene vinylene drivatives, polyphenylene derivatives, polyvinyl carbazole derivatives, polythiophene derivatives, perylene pigment, coumarin pigment, rhodamine pigment, or a result of doping of an organic EL material to the polymers described above, for example. The doping material includes rubrene, perylene, 9,10-diphenylanthracene, tetraphenylbutadiene, nile red, and coumarin 6, for example. Note that the material structuring the light-emitting layer 13C may be a combination of two or more of the materials described above. Moreover, the high-molecular-weight materials described above are not restrictive, and any low-molecular-weight materials may be used in combination. The low-molecular-weight material includes benzin, styrylamine, triphenyl amine, porphyrin, triphenylene, azatriphenylene, tetracyanoquinodimethane, triazole, imidazole, oxadiazol, polyaryl alkane, phenylenediamine, arylamine, oxazole, anthracene, fluorenone, hydrazone, stilbene, or derivatives thereof, or heterocyclic conjugated monomers or oligomers of polysilane compound, vinylcarbazole compound, thiophene compound, and aniline compound, for example.

Other than the materials described above, the material structuring the light-emitting layer 13C may include a material with a high efficiency of light emission as a luminescent guest material, exemplified by a low-molecular-weight fluorescent material, a phosphorescent pigment, and an organic light-emitting material such as metal complex.

Alternatively, the light-emitting layer 13C may be a hole-transporting light-emitting layer serving also as the hole transport layer 13B described above, for example. Still alternatively, the light-emitting layer 13C may be an electron-transporting light-emitting layer serving also as the electron transport layer 13D that will be described later.

The electron transport layer 13D is for improving the efficiency of electron transport to the light-emitting layer 13C. Depending on the entire structure of the device, the thickness of the electron transport layer 13D is preferably in a range from 5 nm to 200 nm, and more preferably, in a range from 10 nm to 180 nm, for example.

The electron transport layer 13D is preferably made of an organic material with the excellent performance of electron transport. Improving the transport efficiency to the light-emitting layer 13C reduces change of color of emission that is to be caused depending on the intensity of an electric field that will be described later. To be specific, the organic material for use preferably includes aryl pyridine derivatives, benzimidazole derivatives, and others. With the use of such an organic material, even if the drive voltage is low, the supply efficiency of electrons is retained high. Other than the materials described above, exemplified are alkali metal, alkali earth metal, rare earth metal, and oxides thereof, complex oxides, fluorides, and carbonate.

The intermediate electrode 14 functions as a cathode, and is made of a material having the excellent light transmission property with a small work function. To be specific, the intermediate electrode 14 is made of alkali metal, alkali earth metal containing magnesium (Mg), and an organic material that easily forms complexes with such metals. The organic material is with BCP (bathocuproine (4,7-diphenyl-2,9-dimethyl-1,10-phenanthroline)) skeleton, bathophenanthroline skeleton, quinoline skeleton, phthalocyanine skeleton, and others, or has the electron transporting characteristics, for example. Although the intermediate electrode 14 is desirably structured not to have the strong absorbency against the visible light regions, if the film thickness thereof is made extremely thin, the resulting influence is sufficiently eliminated. In consideration thereof, the thickness of the intermediate electrode 14 is preferably 10 nm or less, for example. Alternatively, also with the formation of a transparent conductive film using oxides, the efficiency of light extraction is to be ensured. In this case, the use of ZnO, ITO, IZnO, InSnZnO, and others is possible.

The efficiency improving layer 15 is for improving the extraction efficiency of light generated in the light-emitting layer 13C toward the two surface directions. The thickness of the efficiency improving layer 15 is preferably 10 nm or more but 200 nm or less. The efficiency improving layer 15 in this embodiment is in the multi-layer structure including a plurality of layers varying in refractive index. To be specific, the efficiency improving layer 15 includes, in order from the anode 12 side, a layer with a low refractive index (the first layer 15A), a layer with a high refractive index (the second layer 15B), and a layer with a low refractive index (the third layer 15C). Note that the expression of high and low refractive indexes means the refractive index difference of the layers in the efficiency improving layer 15. Herein, the refractive index difference between the first and third layers 15A and 15C is not specifically restrictive, and as long as the refractive indexes thereof are both lower than that of the second layer 15B, the first and third layers 15A and 15C may have the same refractive index.

The efficiency improving layer 15 is made of an organic material. The refractive index of the resulting organic film is defined by the film density thereof, the molecular framework of the organic material in use, and the possible conformation of the molecules. With the efficiency improving layer 15 in this embodiment, the organic material for use preferably has the refractive index in a range of 1.7 to 2.2 with a wavelength of approximately 460 nm.

Moreover, by a direct placement of an organic material having the strong acceptor property and an organic material having the strong donor property, generally, the exciplex level is easily formed on the interface thereof. Therefore, the efficiency improving layer 15 in this embodiment is preferably structured to include layers each made of an acceptor organic material sharing the similar characteristics, or layers each made of a donor organic material. This is not restrictive, and as long as any new exciplex level or others are not formed on the interface, any appropriate combination of layers is possible.

In consideration thereof, a specific material for use to the efficiency improving layer 15 includes a tertiary amine organic compound such as hexaazatriphenylene hexacarbonitrile (HAT-6CN), 4,4,4-tris[N,N-(2-naphthyl)phenyl amino]triphenylamine (2-TNATA), tris[4-(2-thienyl)phenyl] amine (TTPA), and naphthyldiamine ($\alpha$-NPD), for example. The efficiency improving layer 15 (the first to third layers 15A to 15C) may be entirely made of any one of the organic materials, or may be mixedly made of any two or more thereof. Alternatively, a layer made of an electron transporting material may be provided for lamination with the layers made of the organic material(s) described above. Still alternatively, with the aim of adjusting the refractive index or the degree of charge transfer, the efficiency improving layer 15 may be mixedly made of alkali metal and alkali earth metal including Mg, and the resulting organic films made of such organic materials may be used as the first to third layers 15A to 15C considering the refractive indexes thereof.

Herein, the third layer 15C is for improving the adhesion with the cathode 16, and is not necessarily provided.

Similarly to the anode 12 described above, the cathode 16 is in the two-layer structure of the transmissive first layer 16A, and the second layer 16B whose refractive index is relatively higher than that of the first layer 16A. The cathode 16 includes the second and first layers 16B and 16A in this order from the efficiency improving layer 15 side. The entire thickness of the cathode 16 is preferably 30 nm or more but 2500 nm or less. The thickness of the first layer 16A is preferably 5 nm or more but 30 nm or less, and the thickness of the second layer 16B is preferably 100 nm or more but 2000 nm or less. The first and second layers 16A and 16B are respectively structured similarly to the first and second layers 13A and 13B of the anode 13 described above, and are made of the materials described above as appropriate.

(Display)

Figure 2:
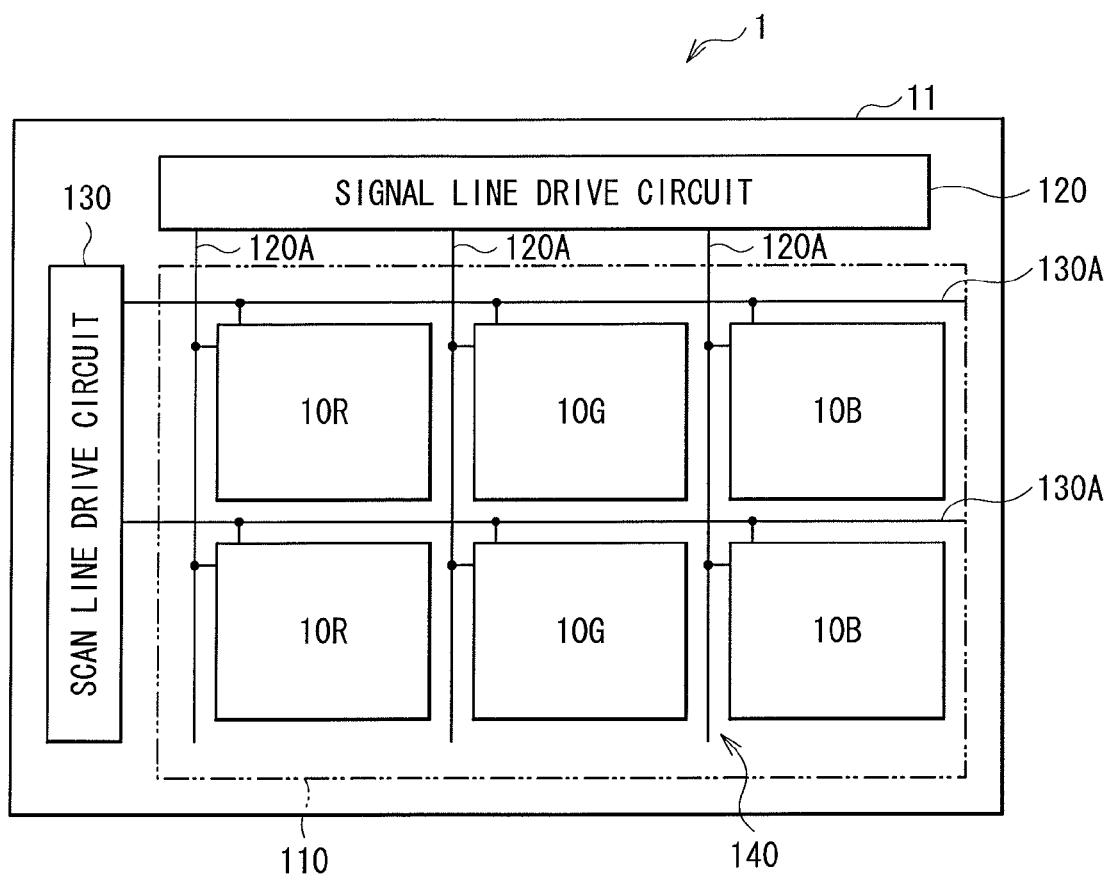
FIG. 2 is a diagram showing a structure of a display including the display devices of FIG. 1.

FIG. 2 is a diagram showing the structure of the display 1 including the display devices 10 of the first embodiment. This display 1 is for use as an organic EL television unit, and the substrate 11 thereof is provided thereon with a display region 110, that is, a matrix arrangement of a plurality of display devices 10 (for example, red light-emitting display devices 10R, green light-emitting display devices 10G, and blue light-emitting display devices 10B). The display region 110 is provided therearound with a signal line drive circuit 120 and a scan line drive circuit 130 as drivers for use of picture display. Herein, a combination of the adjacent display devices 10 configures one pixel.

Figure 3:
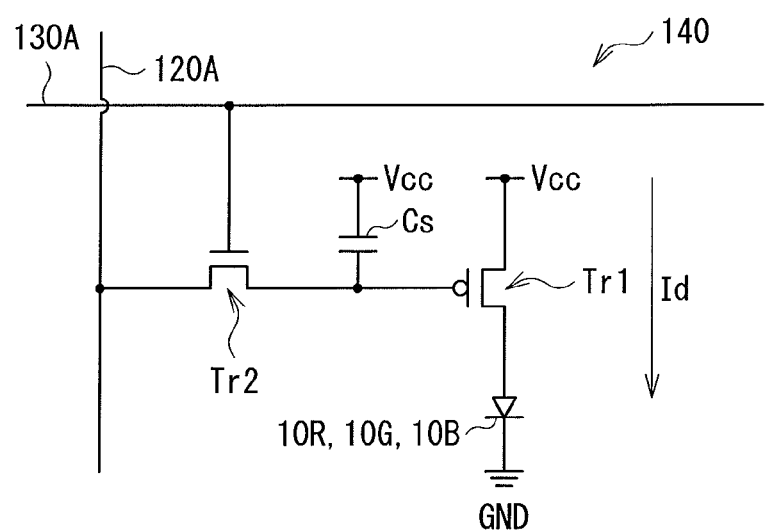
FIG. 3 is a diagram of an exemplary pixel drive circuit shown in FIG. 2.

The display region 110 is provided therein with a pixel drive circuit 140. FIG. 3 shows an example of the pixel drive circuit 140. The pixel drive circuit 140 is an active drive circuit formed on the bottom layer of the anode 12. In other words, this pixel drive circuit 140 includes a drive transistor Tr1, a write transistor Tr2, a capacitor (storage capacity) Cs disposed between the transistors Tr1 and Tr2, and the display devices 10 (for example, the display devices 10R, 10G, and 10B) connected in series to the drive transistor Tr1 between first and second power supply lines (Vcc and GND). The drive transistor Tr1 and the write transistor Tr2 are each structured by a general TFT, and the structure thereof is not specifically restrictive, and may be in the inverted staggered structure (so-called bottom gate structure), or in the staggered structure (top gate structure).

The pixel drive circuit 140 includes a plurality of signal lines 120A in a column direction, and a plurality of scan lines 130A in a row direction. Each intersection of the signal line 120A and the scan line 130A corresponds to any one of the display devices 10 (sub-pixel). The signal lines 120A are each connected to the signal line drive circuit 120, and from the signal line drive circuit 120, an image signal is provided to a source electrode of the write transistor Tr2 over the signal lines 120A. The scan lines 130A are each connected to the scan line drive circuit 130, and from this scan line drive circuit 130, a scan signal is sequentially provided to a gate electrode of the write transistor Tr2 over the scan lines 130A.

Figure 4:
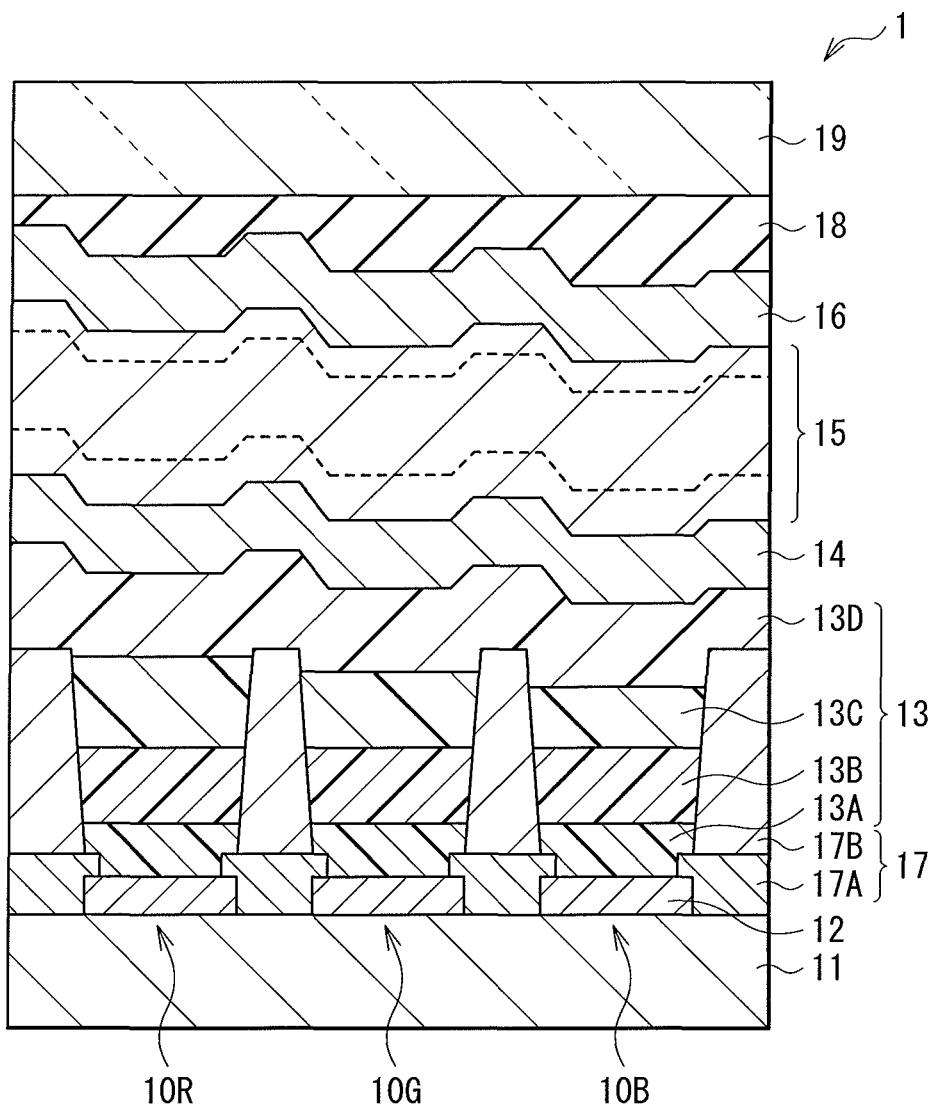
FIG. 4 is a diagram showing an exemplary cross-sectional structure of the display of FIG. 2.

FIG. 4 is a diagram showing the cross-sectional structure of the display region 110 of FIG. 2. The display devices 10 are each structured to include, in order from the substrate 11 side between the drive transistor Tr1 of the pixel drive circuit 140 and a flat insulation film (not shown), the anode 12, the organic layer 13 including the light-emitting layer 13C, the intermediate electrode 14, the efficiency improving layer 15 including the layers varying in refractive index, and the cathode 16 as described above. The display devices 10 are partitioned by the partitions 17. The display devices 10 are covered with a protection layer 18, and are sealed by a sealing substrate 19 made of glass or others being affixed entirely over the protection layer 18 via an adhesion layer (not shown) made of a thermosetting resin or an ultraviolet curable resin. The protection layer 18 is a silicon nitride (typically $Si_3N_4$) film, a silicon oxide (typically $SiO_2$) film, a silicon oxynitride (SiNxOy: composition ratio X>Y) film, a silicon oxynitride (SiOxNy: composition ratio X>Y) film, or a thin film mainly containing carbon such as DLC (Diamond Like Carbon), a CNT (Carbon Nanotube) film, and others. These films are each preferably in the single- or multi-layer structure. In particular, the protection layer made of nitrides has the high-density property, and produces the extremely high blocking effect against moisture, oxygen, and any other impurities adversely affecting the display devices 10.

The partition 17 is for providing, without fail, insulation between the anode 12 and the cathode 16, and for forming the light-emitting region into a desired shape. The partition 17 also functions as a wall at the time of formation of the organic layer 13 by inkjet coating, nozzle coating, or others. The partition 17 includes a lower partition 17A, and an upper partition 17B thereon. The lower partition 17A is made of an inorganic insulating material such as $SiO_2$, and the upper partition 17B is made of a photosensitive resin such as positive-type photosensitive polybenzoxazole, or positive-type photosensitive polyimide. The partition 17 is formed with an aperture at the position corresponding to the light-emitting region. Herein, the organic layer 13 or the cathode 16 may be provided not only on the aperture but also on the partition 17, but light emission occurs only on the aperture of the partition 17.

The protection layer 18 may have the thickness of 2 to 3 μm, and may be made of either an insulating material or a conductive material, for example. The insulating material is preferably inorganic amorphous, including amorphous silicon ($\alpha$-Si), amorphous silicon carbide ($\alpha$-SiC), amorphous silicon nitride ($\alpha$-$Si_{1-x}N_x$), and amorphous carbon ($\alpha$-C), for example. The inorganic amorphous insulating material as such is low in water permeability because no grain is formed thereby so that the resulting film is an excellent protection film.

The sealing substrate 19 is located on the cathode 16 side of the display devices 10, and is for sealing the display devices 10 together with the adhesion layer (not shown). The sealing substrate 19 is made of a material such as glass being transparent against light generated by the display devices 10. The sealing substrate 19 may be provided with a color filter and a light shielding film as a black matrix (neither is shown), for example. Alternatively, the sealing substrate 19 may extract the light generated by the display devices 10, and may absorb the outside light reflected by wiring between the display devices 10 with the aim of enhancing the contrast. Herein, the display is supposed to ensure the transmittance of the panel in its entirety, and if the display is in full color not by a color filter but by colors of emission of the display devices themselves such as RGB, that is preferable. Similarly to the black matrix, the transmittance of the entire panel is supposed to be ensured, and preferably, the choice is arbitrarily made considering the structure of the devices in their entirety.

The color filter includes filters of red, green, and blue (none is shown), which are disposed in order. These filters of red, green, and blue are each in the rectangular shape, and are arranged with no space therebetween. These filters of red, green, and blue are each structured by a resin mixed with pigment. Through selection of pigment, the transmittance of light is so adjusted as to be high in the wavelength range of any target color, i.e., red, green, or blue, and to be low in the wavelength range of the remaining colors.

The light shielding film is structured by a film of black resin being a mixture of resin and a black coloring agent and has the optical density of 1 or higher, or by a thin-film filter utilizing the thin-film interference. The light shielding film is preferably structured by the black resin film as is formed easily at a lower cost. The thin-film filter is a laminate of one or more thin films made of metal, metal nitrides, or metal oxides, for attenuation of light utilizing the thin-film interference, for example. The specific example of such a thin-film filter includes a laminate of Cr and chromium oxides (III) ($Cr_2O_3$), which are alternately disposed.

In this example, the layers of the display device 10 from the anode 12 to the cathode 16 are each formed by dry process such as vacuum deposition, ion beam (EB: Electron Beam), Molecular Beam Epitaxy (MBE), sputtering, and OVPD (Organic Vapor Phase Deposition).

In addition to the methods described above, the organic layer 13 may be formed also by wet process including coating such as laser induced thermal imaging, spin coating, dipping, doctor blading, discharge coating, and spray coating, and printing such as inkjet printing, offset printing, letterpress printing, intaglio printing, screen printing, and microgravure coating. The wet process and the dry process as such may be applied together as appropriate to the properties of the layers in the organic layer and the components.

In this display 1, a scan signal is provided to each pixel from the scan line drive circuit 130 via the gate electrode of the write transistor Tr2, and from the signal line drive circuit 120, an image signal is stored in the storage capacity Cs via the write transistor Tr2. In other words, the drive transistor Tr1 is ON/OFF controlled in response to the signal stored in the storage capacity Cs. As a result, a drive current Id is injected to the display devices 10, and therefore light emission occurs by recombination between positive holes and electrons.

With the currently available transparent display, the contrast is enhanced and the viewability is improved by using the display devices having the strong cavity effect as described above, and by concentrating light generated in the light-emitting layer toward the front. With such a transparent display structured by the display devices having the strong cavity effect, however, the intensity of light emission is extremely low on the rear surface side, and the rear surface is like a mirror. Therefore, the viewability from the rear surface side is extremely poor, and the interactivity expected to the transparent display from both directions of the front and rear surfaces is thus not realized. Moreover, the viewing angle dependence of chromaticity and that of luminance are both high even on the front surface side with the good viewability. The transparent display is thus failing to provide the best appeal thereof, that is, allow viewing of the same display screen no matter from which direction. Further, the transmittance of the display at the time of viewing from the front is not enough, thereby resulting in a difficulty in providing viewers a sense of unity between another world visible through the screen and the display section.

On the other hand, in the embodiment, the anode 12 and the cathode 16 sandwiching therebetween the organic layer 13 including the light-emitting layer 13C and others are each in the two-layer structure, respectively including the transmissive first layers 13A and 16A, and the transmissive second layers 12B and 16B whose refractive index is higher than that of the first layers 12A and 16A. In the two-layer structure, the second layers 12B and 16B having the higher refractive index are both located on the organic layer 13 side. Moreover, between the organic layer 13 and the cathode 16, provided is the efficiency improving layer 15 including the first layer 15A with a low refractive index, the second layer 15B with the refractive index higher than that of the first layer, and the third layer 15C with the refractive index lower than that of the second layer 15B in this order from the organic layer 13 side. With such a structure, the strong cavity effect is reduced, and the efficiency of light extraction to the front and rear surfaces is improved.

As described above, with the display device 10, and the display 1 provided therewith in the first embodiment, the strong cavity effect is reduced with the anode 13 including the transmissive first layer 13A, and the transmissive second layer 13B whose refractive index is higher than that of the first layer 13A in this order from the substrate 11 side. The viewing angle dependence is thus reduced, and the light transmission property from the rear surface (the substrate 11) side is improved. Moreover, the efficiency of light extraction in the directions of both surfaces is improved, and the efficiency of light emission is improved with the provision of the efficiency improving layer 15 and the cathode 16 in this order above the intermediate electrode 14, which is provided on the anode 12 via the organic layer 13 including the light-emitting layer 13C. The efficiency improving layer 15 in this embodiment includes the first layer 15A having a low refractive index, and the second layer 15B having the refractive index higher than that of the first layer 15A in this order. The cathode 16 in this embodiment includes the transmissive second layer 16B having a high refractive index, and the transmissive first layer 16A having the refractive index lower than that of the second layer 16B in this order. In other words, such a structure increases the transmittance in the both directions (the front and rear surfaces), and reduces the viewing angle dependence (especially the viewing angle dependence on chromaticity), thereby improving the viewability. To be specific, such a structure achieves a transmittance difference of 0.5 or lower in various wavelengths (visible light regions of 450 nm to 700 nm), in other words, achieves a relative ratio of 0.5 or higher between the maximum and minimum values of the transmittance in the visible light regions. Furthermore, the display devices 10, especially the electrodes 12, 14, and 16 are improved in light transmission property so that the resulting display is with a high transmittance.

What is more, with the improved efficiency of light emission and the improved viewability, the power consumption is also to be reduced.

Further, in the first embodiment, for use as the third layer 15C of the efficiency improving layer 15, a layer whose refractive index is lower than that of the second layer 15B is provided between the second layer 15B and the cathode 16. This structure improves the adhesion with the cathode 16, thereby increasing the long-term reliability.

In a full-color display, the full-color is realized by using display devices each emitting a color of red (R), green (G), blue (B), or others, or by using a combination of white light-emitting display devices and a color filter. In the display using the display devices of various colors, however, the manufacturing process takes long and is complicated due to a process of coloring each of the light-emitting layers individually in red, green, or blue. On the other hand, in the display using a combination of white light-emitting display devices and a color filter, the layers structuring the display devices are each a solid film. The manufacturing process is thus short and simple. As such, the display using the white light-emitting display devices leads to a high manufacturing yield, and is promising as the cost-reducible structure.

With the display device in the strong cavity structure as described above, however, there is no optical path length satisfying both the several emission peak wavelengths of the white color and the whole emission spectrum thereof. Therefore, the colors of R, G, and B have their own optical lengths from the emission center of the light-emitting layers of R, G, and B to the electrode interface forming the reflection surface. In this sense, the strong cavity structure is considered effective for the display devices adjusted in film thickness as appropriate to the colors of emission, more specifically, for the display devices including the light-emitting layers each in red, green, and blue. Therefore, the strong cavity structure is not suitable for any display being high in manufacturing yield and cost reducible.

On the other hand, as described in the first embodiment, with the display device 10 not actively using the strong cavity effect, compared with the strong-cavity devices, the optimum optical interference distance for the respective colors of R, G, and B is with a large margin of the optical length. Therefore, the display device 10 is more advantageous in terms of structuring the white light-emitting display device than the display device in the strong cavity structure. More specifically, with the display device 10 in the first embodiment, in addition to the effect described above, a display including the display device 10 of the embodiment achieves a high manufacturing yield and reduces the cost.

Note that, for structuring a full-color display using the white light-emitting display devices, a color filter is expected to use. In particular, when display devices in a transparent display are the white light-emitting display devices, two pieces of color filters are expected to use on the front and rear surfaces because there is a possibility of causing a difference of colors of emission between the two directions. However, using the color filters as such may reduce the transmittance of a panel in its entirety due to the reasons described above. Note that such a transparent display seems to be applicable to a display performing display differently in two directions. As an example, when the display panel of a notebook PC (Personal Computer) is a transparent display for display of text characters, the text on the side opposite to a viewer is inverted, and no interactivity is expected in the first place. In such a case, a color filter may be provided on the viewer's side only and not on the opposite side, and with such a device structure, the resulting use conditions are deemed to be suitable for the full-color display using the white light-emitting display devices as described above. Moreover, for any advertising medium displaying picture information including extremely little amount of text characters, or for any display providing added value to the environment (for example, any environmental device representing the spatial extent by display of nature scenery), this system seems to be an appealing device.

Second Embodiment

Figure 5:
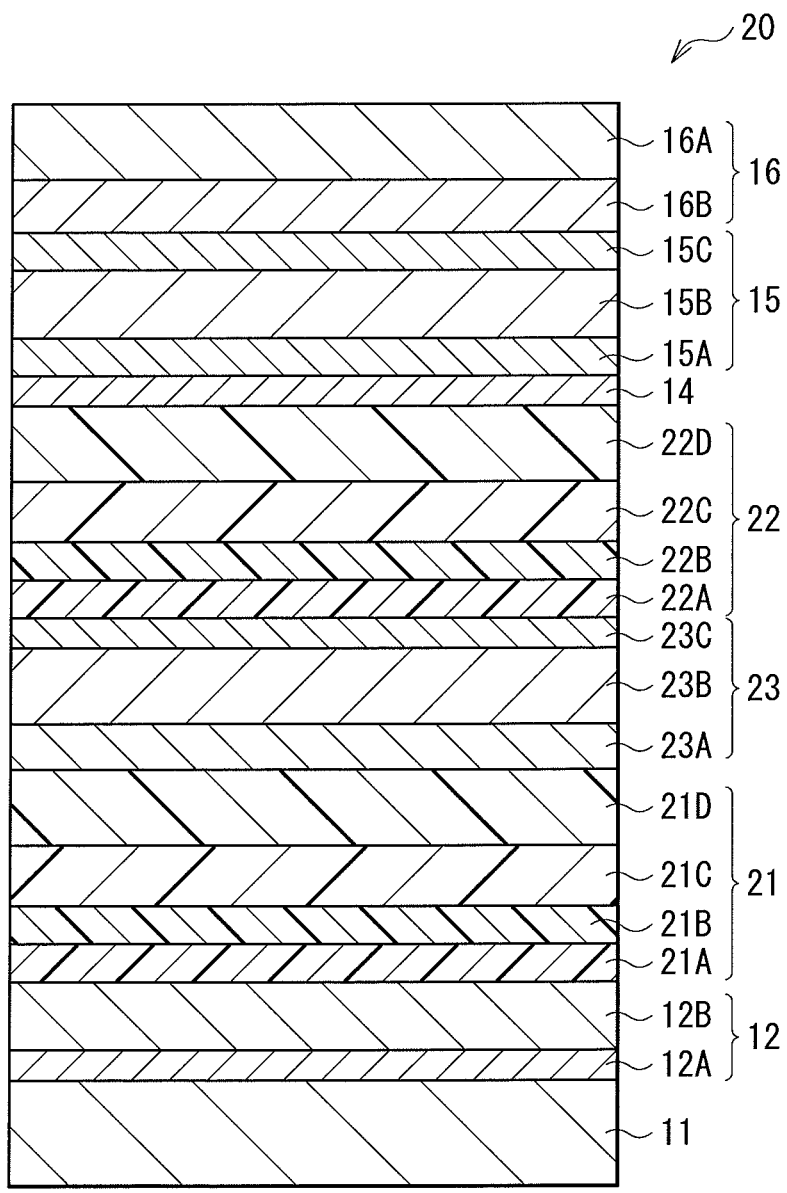
FIG. 5 is a cross-sectional view of a display device according to a second embodiment of the present disclosure.

FIG. 5 is a diagram showing the cross-sectional structure of a display device 20 according to a second embodiment of the present disclosure. The display device 20 in the second embodiment is in the so-called tandem structure, which is the difference from the first embodiment described above. In the tandem structure, two organic layers (organic layers 21 and 22) each including a light-emitting layer are disposed one on the other via a connection layer 23 between the anode 12 and the intermediate electrode 14. The organic layers 21 and 22 are both structured similarly to the organic layer 13 in the first embodiment described above, and respectively include hole injection layers 21A and 22A, hole transport layers 21B and 22B, light-emitting layers 21C and 22C, and electron transport layers 21D and 22D in this order from the anode 12 side. For the organic layers 21 and 22 in the second embodiment, the film thicknesses and the materials described for the layers in the organic layer 21 in the above first embodiment may be selected for use as appropriate. Herein, the light-emitting layers 21C and 22C may be each in the single- or multi-layer structure. As an example, the light-emitting layer 21C may be in the multi-layer structure of red and green light-emitting layers, and the light-emitting layer 22C may be in the single-layer structure of blue light-emitting layer, thereby forming a white light-emitting display device. Alternatively, a white light-emitting display device may be formed by the light-emitting layer 21C being an orange light-emitting layer, and the light-emitting layer 22C being a blue green light-emitting layer.

The connection layer 23 is for connecting together the organic layers 21 and 22. As for the material of the connection layer 23, the material of a layer between the organic layers in the display device in the previous tandem structure may be used. Such a material includes bathocuproin (BCP) and caesium (Cs), or Alq3 and lithium (Li), for example. The connection layer 23 in the following structure is additionally provided with the function of photoelectric conversion together with the connection function. As a result, the display device 20 is improved in efficiency of light emission, and the life characteristics are also improved.

The connection layer 23 is in the laminated structure including the electron injection layer 22A, the intermediate layer 22B, and the hole injection layer 22C in this order from the anode 12 side, for example. Depending on the entire structure of the device, the film thickness of the connection layer 23 in its entirety is preferably in a range from 1 nm to 100 nm, and more preferably, in a range from 10 nm to 50 nm, for example.

The material of the connection layer 23 is selected as appropriate to the characteristics of the layers adjacent thereto, i.e., the electron transport layer 21D of the organic layer 21, and the hole injection layer 22A of the organic layer 22. Described below are exemplary materials of the electron injection layer 23A, the intermediate layer 23B, and the hole injection layer 23C.

The electron injection layer 23A has the electron donor property, and the material thereof includes an electron transporting material as a result of doping of an N-type dopant, to be specific, the materials exemplified above for use to the electron transport layer 21D are used. The N-type dopant includes alkali metal, alkali earth metal, or oxides thereof, complex oxides, fluorides, and organic complex, for example.

In particular, when the electron transport layer 21D in the organic layer 21 has a relatively high electron mobility, and when there is no big obstacle for injection between the electron transport layer 21D and the electron injection layer 23A, a material for use is expected to be low in electronegativity and excellent in electron donor property. Most of all, a preferable material is low in light absorption in a visible light region in the shape of film. Such a material is specifically exemplified by alkali metal including Li, Na, K, Rb, Cs, and others, or alkali earth metal including Be, Mg, Ca, Sr, Ba, Ra, and others.

The electron injection layer 23A (electron donor unit) may be made only of the alkali metal or alkali earth metal described above, but if a co-evaporation film is formed with Ag, In, Al, Si, Ge, Au, Cu, Zn, or others, the stability of the state of film is to be improved. Herein, the co-evaporation film may be formed with a mixture of three or more of the metals described above. If this is the case, with the aim of suppressing any optical absorption loss as much as possible, the minimum film thickness is preferable on the precondition that the function is fully used, and the stability is secured as a film. An exemplary suitable film thickness is 5 nm or less. The electron donor unit 23A formed by co-evaporation may be a film being a mixture of the alkali metal or alkali earth metal described above and an organic material. The organic material for mixture use as such preferably has a high electron transportability, but may also be high in insulation or a hole transporting material. An example includes Alq3, or α-NPD. Considering the stability in the film of alkali metal and alkali earth metal, an organic material for use preferably forms a metal complex of such alkali metal and alkali earth metal. Such an organic material is specifically exemplified by bathophenanthroline, or bathocuproin or oxadiazole skeleton, that is, an organic material with a skeleton easy to form complexes.

The intermediate layer 23B has the function of photoelectric conversion, and is made of one or more of materials having such a function of photoelectric conversion. This accordingly improves the transportation efficiency of positive holes and electrons to be injected from the sides of the anode 12 and the cathode 14 to the organic layers 21 and 22, respectively. Such a material(s) are preferably those leading to the energy level of the lowest unoccupied molecular orbital (LUMO) of the intermediate layer 23B (photoelectric conversion unit) being equivalent to or shallower than the shallow value considering the vacuum level of LUMO of the adjacent layers, i.e., the electron injection layer 23A (electron donor unit), and the hole injection layer 23C (electron acceptor unit), and more preferably, those leading to the energy level thereof being shallower. Such a material(s) are preferably also those leading to the energy level of the highest occupied molecular orbital (HOMO) of the photoelectric conversion unit 23B being equivalent to or deeper than the deep value considering the vacuum level of HOMO of the adjacent layers, i.e., the electron donor unit 23A, and the electron acceptor unit 23C, and more preferably, those leading to the energy level thereof being deeper.

To be specific, preferably used are perylene derivatives represented by chemical formula 1 below, porphyrin derivatives represented by chemical formula 2, phthalocyanine derivatives represented by chemical formula 3, naphthalocyanine derivatives represented by chemical formula 4, and pentacene derivatives represented by chemical formula 5.

[Chemical Formula 1]

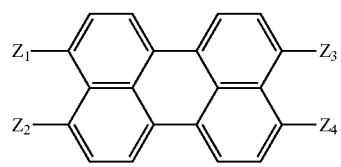

(1)

($Z_1$ to $Z_4$ each individually denote a group containing a carbonyl group or derivatives thereof. $Z_1$ and $Z_2$, and $Z_3$ and $Z_4$ may be each in the ring structure via nitrogen or oxygen.)

[Chemical Formula 2]

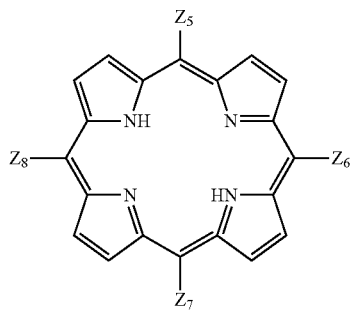

(2)

($Z_5$ to $Z_8$ are each individually denote an aromatic ring group, a heterocyclic group, or derivatives thereof)

[Chemical Formula 3]

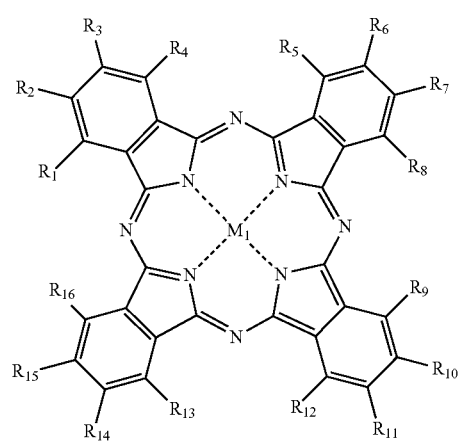

(3)

($R_1$ to $R_{16}$ each individually denote a hydrogen atom, a halogen atom, or a hydrocarbon group with the carbon number of 1 to 12 or derivatives thereof. M1 denotes metal atoms in Groups 4 to 14 in the periodic table, or a group of atoms containing the metal atoms and oxygen atoms, halogen atoms or a cyano group, a methoxy group, or others as ligand.)

[Chemical Formula 4]

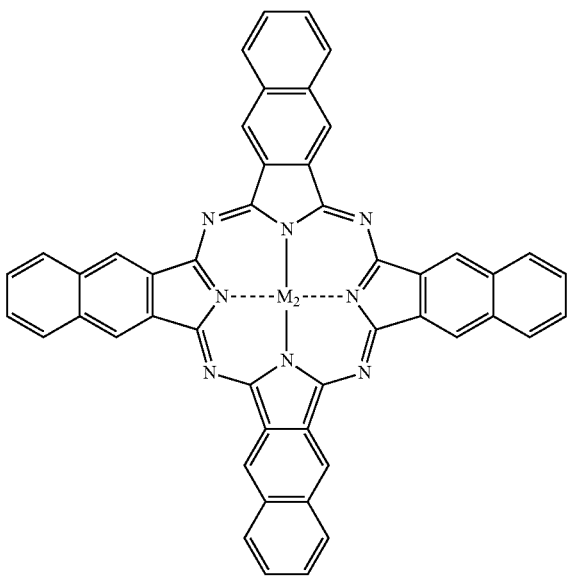

(4)

(M2 denotes metal atoms in Groups 4 to 14 in the periodic table, or a group of atoms containing the metal atoms and oxygen atoms, halogen atoms or a cyano group, a methoxy group, or others as ligand.)

[Chemical Formula 5]

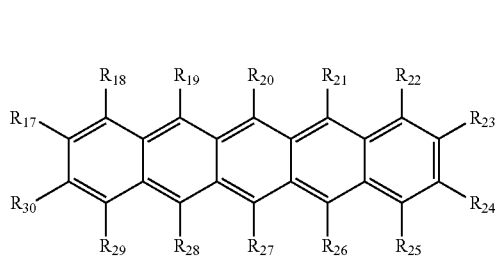
(5)

(R17 to R30 each individually denote a hydrogen atom, a halogen atom, or a hydrocarbon group with the carbon number of 1 to 12 or derivatives thereof.)

Note that, in the metal atoms in Groups 4 to 14 in the periodic table described above, the preferable use is Group 4 (especially Ti), Group 5 (especially V), Group 6 (especially Mo), Group 7 (especially Mn), Group 8 (Fe, Ru, and Os), Group 9 (Co, Rh, and Ir), Group 10 (Ni, Pd, and Pt), Group 11 (especially Cu), Group 12 (especially Zn), Group 13 (especially Al), and Group 14 (especially Pb).

The perylene derivatives represented in Chemical Formula 1 specifically include compounds in the following chemical formulas (1-1) to (1-3), for example.

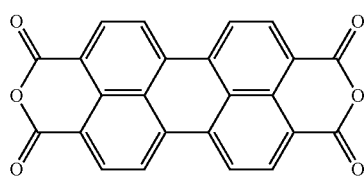
(1-1)

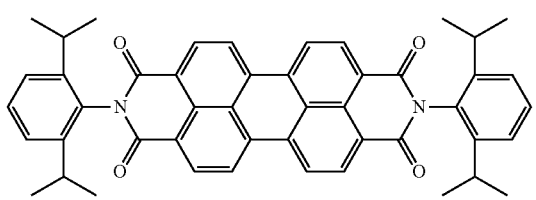
(1-2)

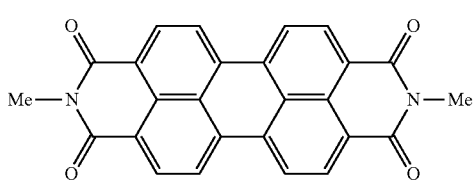
(1-3)

The porphyrin derivatives represented in Chemical Formula 2 specifically include compounds in the following chemical formulas (2-1) to (2-4), for example.

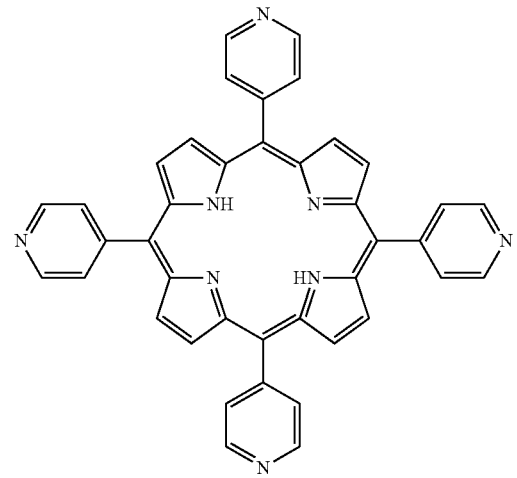
(2-1)

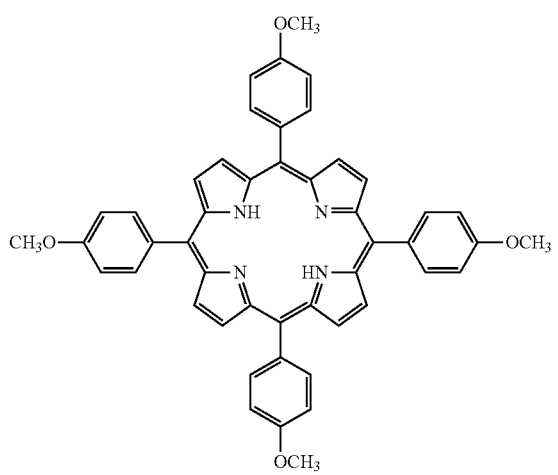
(2-2)

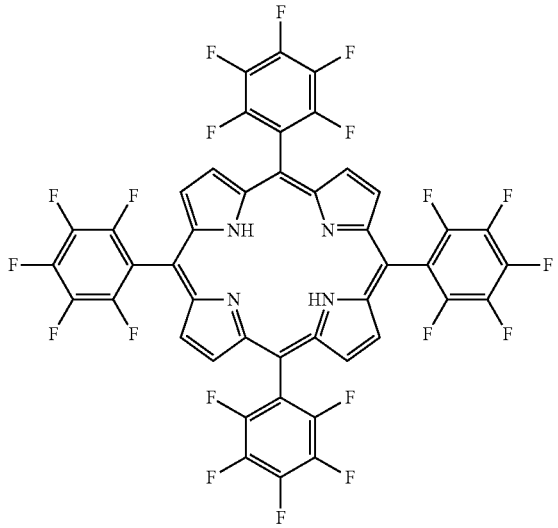
(2-3)

(2-4)
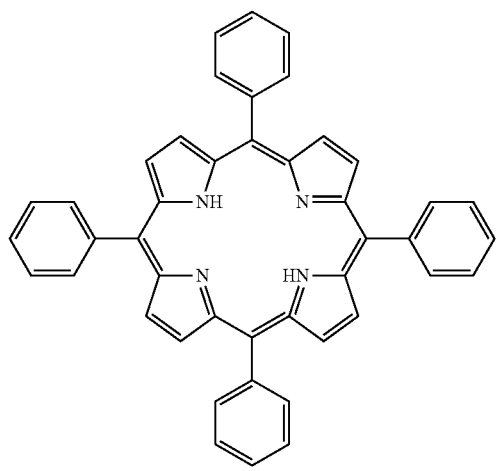
The phthalocyanine derivatives represented in Chemical Formula 3 specifically include compounds in the following chemical formulas (3-1) to (3-17), for example.
(3-1)
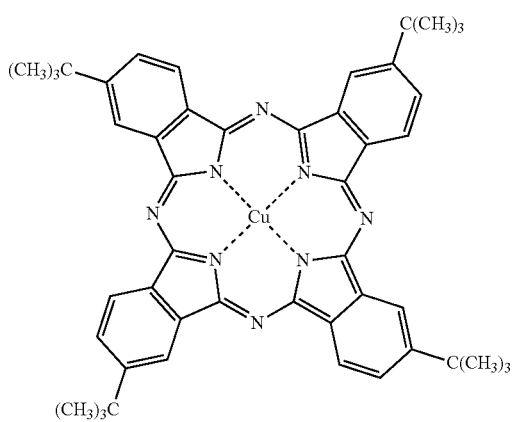
(3-2)
(3-3)
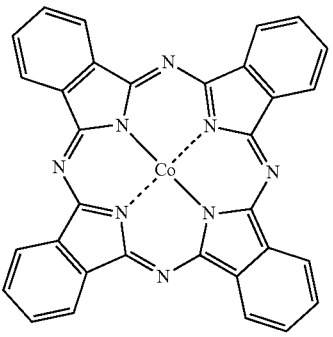
(3-4)
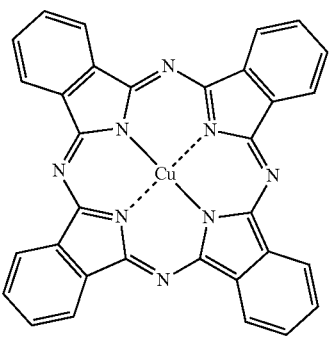
(3-5)
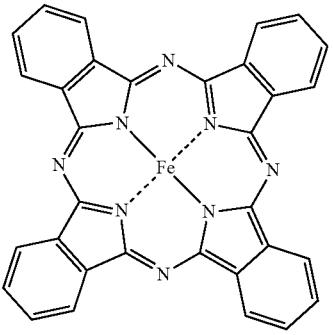
(3-6)
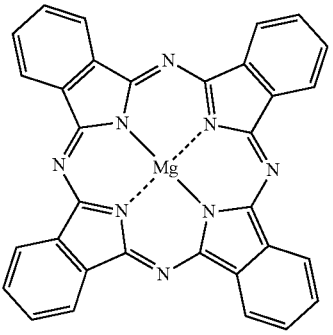

-continued
(3-7)
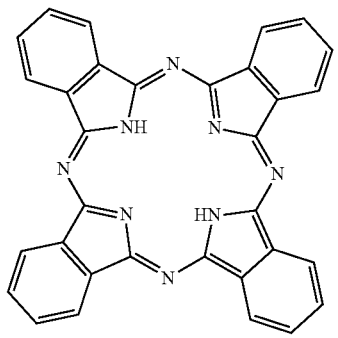
(3-8)
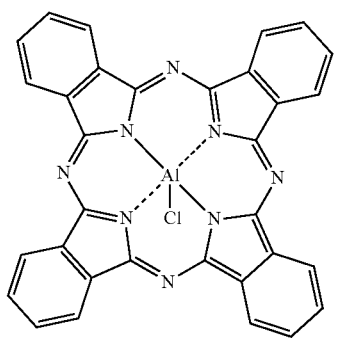
(3-9)
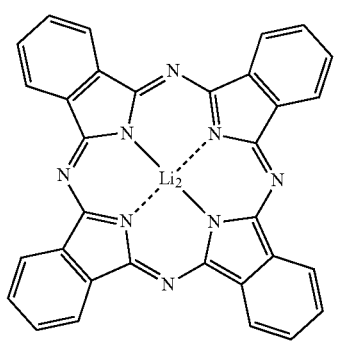
(3-10)
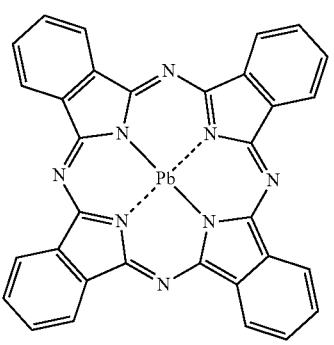
-continued
(3-11)
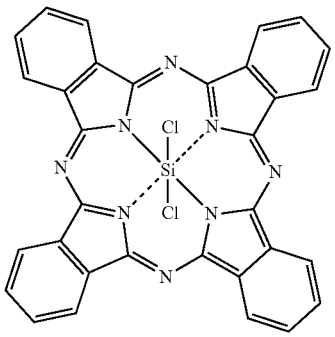
(3-12)
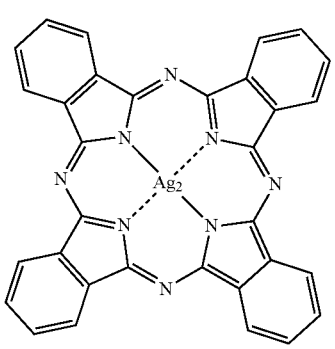
(3-13)
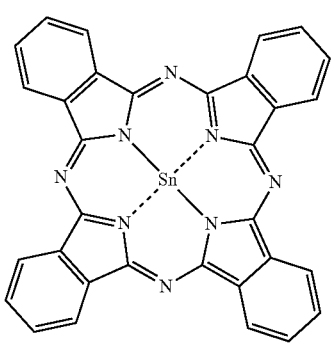
(3-14)
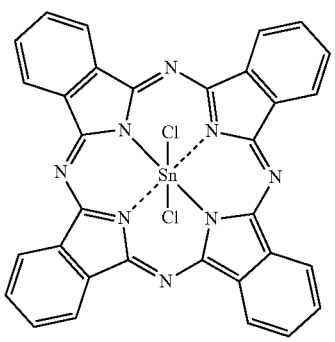

(3-15)
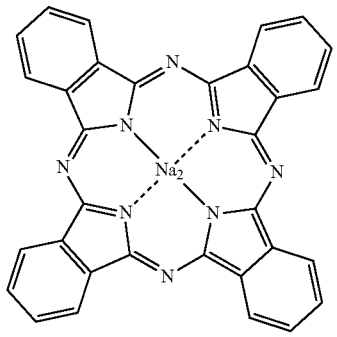

(3-16)
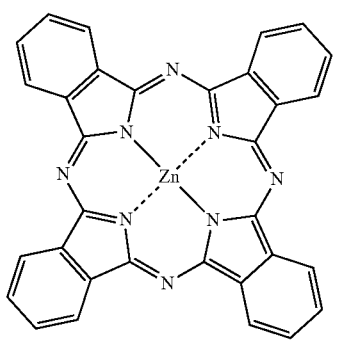

(3-17)
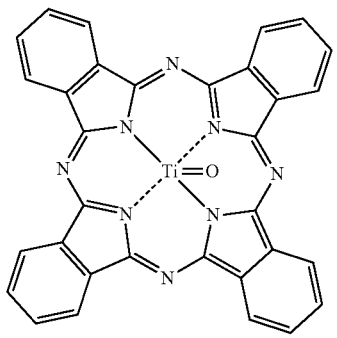

The Naphthalocyanine derivatives represented in Chemical Formula 4 specifically include a compound in the following chemical formula (4-1), for example.

(4-1)
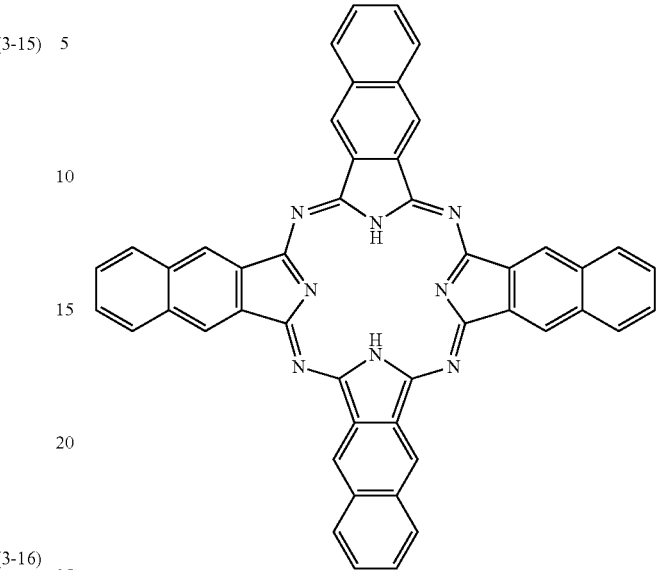

The pentacene derivatives represented in Chemical Formula 5 specifically include a compound in the following chemical formula (5-1), for example.

(5-1)
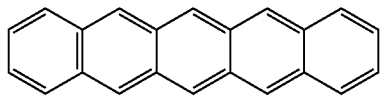

In addition to the compounds described above, the material having the function of photoelectric conversion includes fullerene, carbon nanotube, grapheme, or derivatives thereof with the number of carbon atoms of 60 or larger in the chemical formulas (6-1) to (6-4), for example.

(6-1)
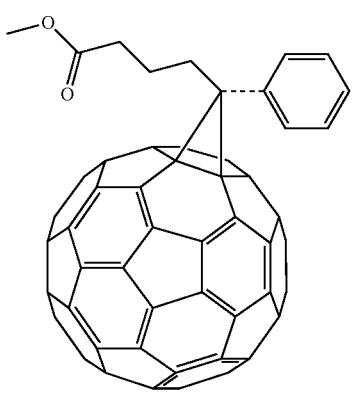

(6-2)

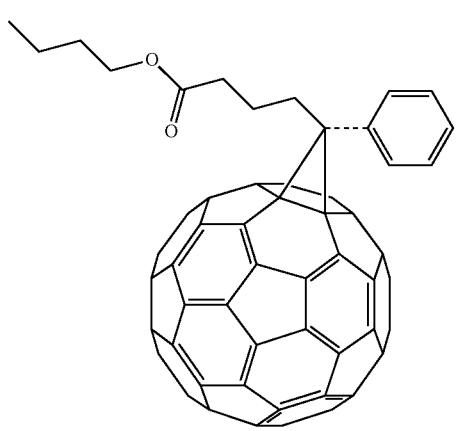

(6-3)

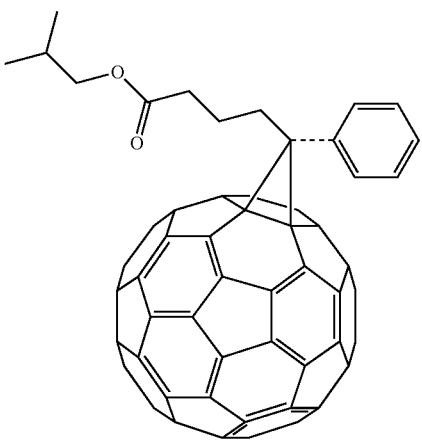

(6-4)

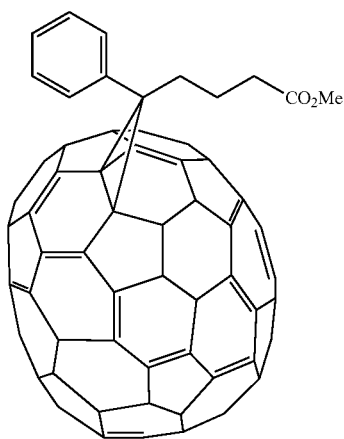

The hole injection layer 23C (the electron acceptor unit) has the electron acceptor property, and the material thereof includes a hole transporting material as a result of doping of P-type dopant, for example. The hole transporting material includes the materials exemplified for use to the hole transport layer 13B described above, for example. The P-type doping material is exemplified by 7,7,8,8-tetracyano-2,3,5,6-tetrafluoroquinodimethane (F4-TCNQ), and hexaazatriphenylene (HAT-6CN).

In particular, when there is no big obstacle for injection between the hole injection layer 22A of the organic layer 22 and the electron acceptor unit 23C, the concept same as the material selection for the electron donor unit 23A described above is applied, and the use of an organic material excellent in electron acceptor property is possible, for example. To be specific, the hole injection layer 23C may be made entirely of an electron acceptor organic material with the skeleton of azatriphenylene, TCNQ, or others, or may be made mixedly of the material with metal, for example. This is not restrictive, and similarly to the electron acceptor organic material, an organic material with a high hole mobility may be used similarly for film formation solely or with metal, for example. The metal herein includes alkali metal, alkali earth metal including Mg, or metal in Group of IIIB and IVB in the periodic table. The material is preferably low in light absorption in the visible light region in the state of film similarly to the electron donor unit 23A described above. As to the film thickness, with the aim of suppressing any optical absorption loss as much as possible, the minimum film thickness is preferable on the precondition that the function is fully used, and the stability is secured as a film. An exemplary suitable film thickness is 300 nm or less.

Note that the N-type doping material, the photoelectric conversion material, and the P-type doping material are no more than examples, and any materials will serve well as long as allowing the efficient transport of electrons or positive holes to the organic layer 21 and the organic layer 22 in the connection layer 23. Moreover, the electron donor unit 23A and the electron acceptor unit 23C do not necessarily include the doping materials described above, and may be made of one specific material as long as the characteristics thereof are secured.

Further, in the connection layer 23, the electron donor unit 23A or the electron acceptor unit 23C may serve also as the photoelectric conversion unit 23B. Still further, the connection layer 23 may be in the two-layer structure without either the electron donor unit 23A or the electron acceptor unit 23C. Alternatively, the connection layer 23 may include only the photoelectric conversion unit 23B without both of the units 23A and 23C.

With the display device 20 in the second embodiment, the two organic layers (the organic layers 21 and 22) are in the tandem structure, i.e., disposed one on the other, via the connection layer 23. The effect of improving the efficiency of light emission is thus achieved in addition to the effect of the display device 10 in the first embodiment described above. Moreover, with the use of the layer having the photoelectric conversion (the intermediate layer 23B) as the connection layer 23, the display device 20 is improved in efficiency of light emission, and the life characteristics are also improved. Herein, the connection layer 23 may be in the two-layer structure not including the intermediate layer 23B but only the electron injection layer 23A and the hole injection layer 23C. Even if this is the structure, the life characteristics of the display device 20 are improved more than any display device in the previous tandem structure.

[Modification]

Figure 6:
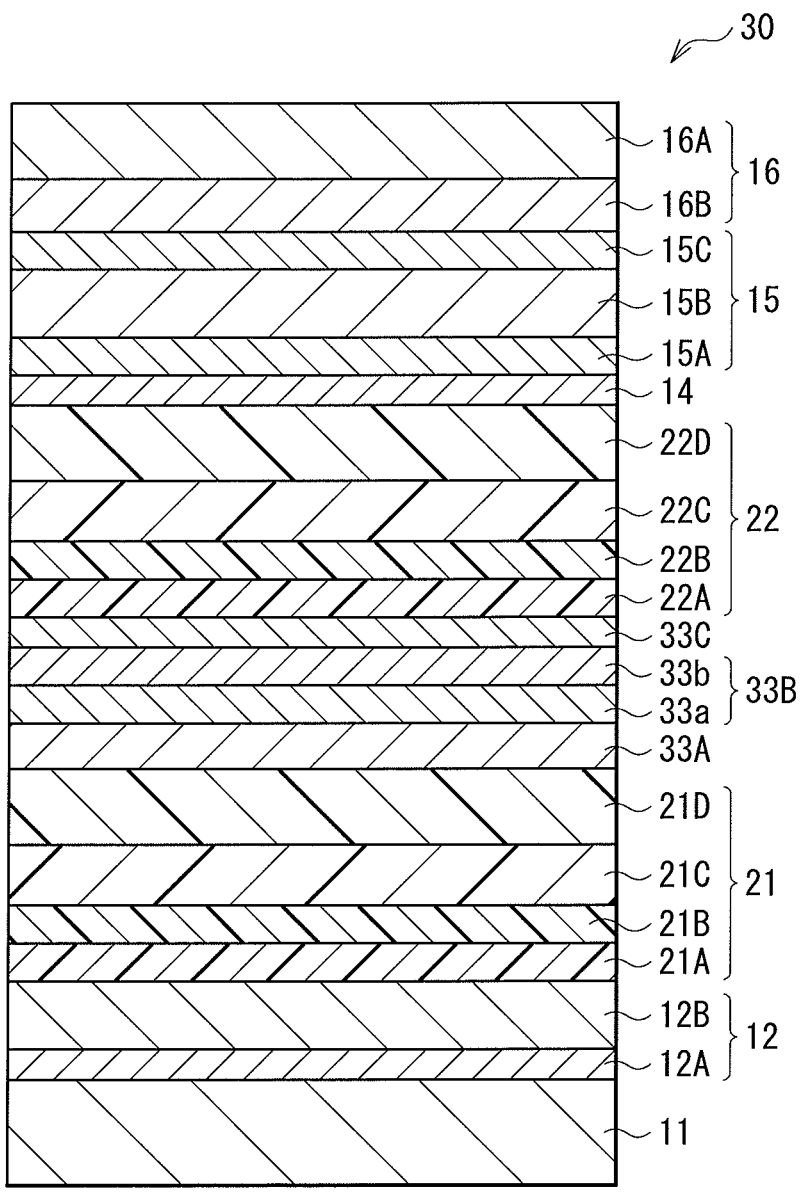
FIG. 6 is a cross-sectional view of a display device according to a modification.

FIG. 6 is a diagram showing the cross-sectional structure of a display device 30 in a modification of the second embodiment. In the display device 30 in this modification, a connection layer 33 is in the four-layer structure. To be specific, in the connection layer 33, an intermediate layer 33B (photoelectric conversion unit) is in the two-layer structure, i.e., includes first and second layers 33a and 33b. The first layer 33a is an electron acceptor photoelectric conversion unit, and the second layer 33b is an electron donor photoelectric conversion unit. Also with the photoelectric conversion unit 33B in the two-layer structure as such, the effect similar to that of the embodiments is also produced. Moreover, with the connection layer 33 in such a structure, the effect similar to that of the second embodiment described above is produced even with the fewer layers in the organic layers 21 and 22. However, since there is a possibility of reducing the stability in long-time drive, the device structure is expected to be arbitrarily selected considering the efficiency of light emission, the stability in long-time drive, and others.

APPLICATION EXAMPLES

Described below are application examples of the display provided with the display devices described in the embodiments and modification above. The display described in the above embodiments is applicable to displays of electronic units in any fields that display picture signals coming from the outside or those generated inside as images or pictures. Such electronic units are exemplified by a television unit, a digital camera, a notebook personal computer, a portable terminal device such as mobile phone, or a video camera.

[Module]

Figure 7:
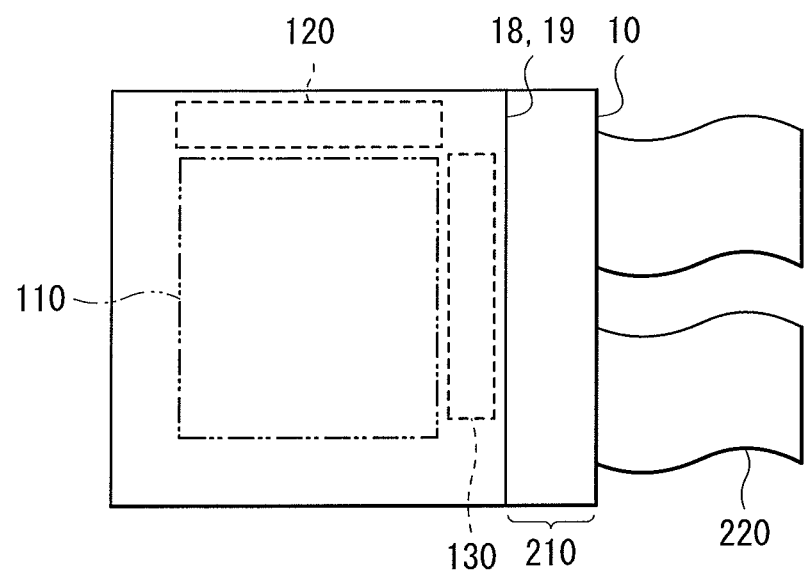
FIG. 7 is a plan view of a module including the display according to the first and second embodiments and the modification, showing the schematic structure thereof.

The display in the embodiments and modification above is incorporated as a module of FIG. 7, for example, into various types of electronic units in Application Examples 1 to 5 that will be described below. This module includes a region 210 on one side of the substrate 11 to expose from the protection layer 18 and the sealing substrate 19. To this exposed region 210, the wiring of the signal line drive circuit 120 and that of the scan line drive circuit 130 are extended so that an external connection terminal (not shown) is formed. This external connection terminal may be provided with a flexible printed circuit (FPC) 220 for use of signal input and output.

Application Example 1

Figure 8:
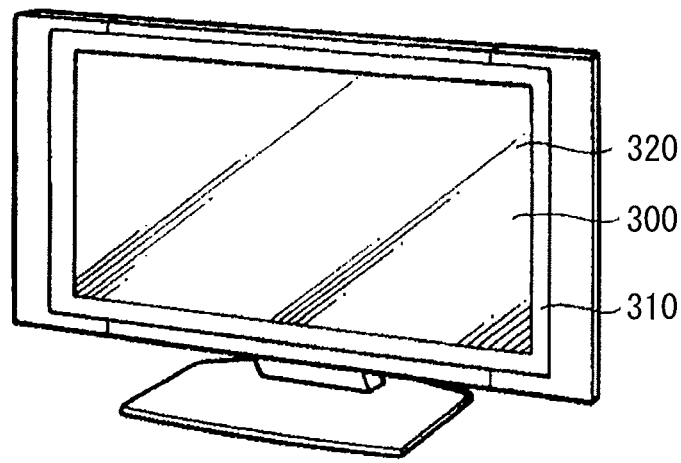
FIG. 8 is a perspective view of, in Application Example 1, the display according to the first and second embodiments and the modification, showing the outer appearance thereof.

FIG. 8 shows the outer appearance of a television unit to which the display of the embodiments and modification described above is applied. This television unit is provided with a picture display screen section 300 including a front panel 310 and a filter glass 320, for example. This picture display screen section 300 is structured by the display according to the embodiments and others described above.

Application Example 2

Figure 9A:
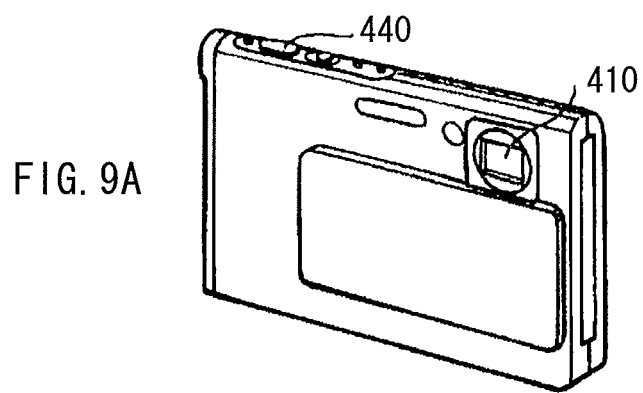
FIG. 9A is a perspective view of a unit in Application Example 2, showing the outer appearance thereof viewed from the front side.
Figure 9B:
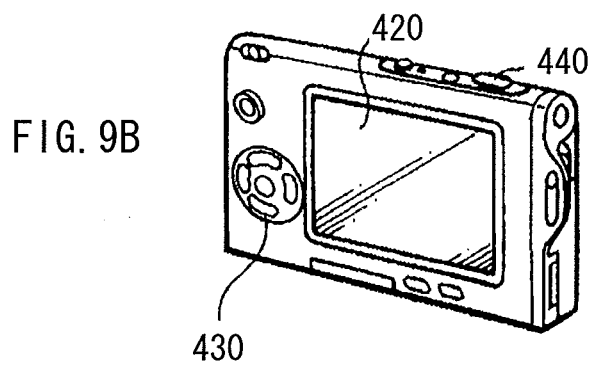
FIG. 9B is a perspective view thereof showing the outer appearance viewed from the rear side.

FIGS. 9A and 9B each show the outer appearance of a digital camera to which the display of the embodiments and modification described above is applied. This digital camera is provided with a light-emitting section 410 for flash use, a display section 420, a menu switch 430, and a shutter button 440, for example. The display section 420 is structured by the display according to the embodiments and others described above.

Application Example 3

Figure 10:
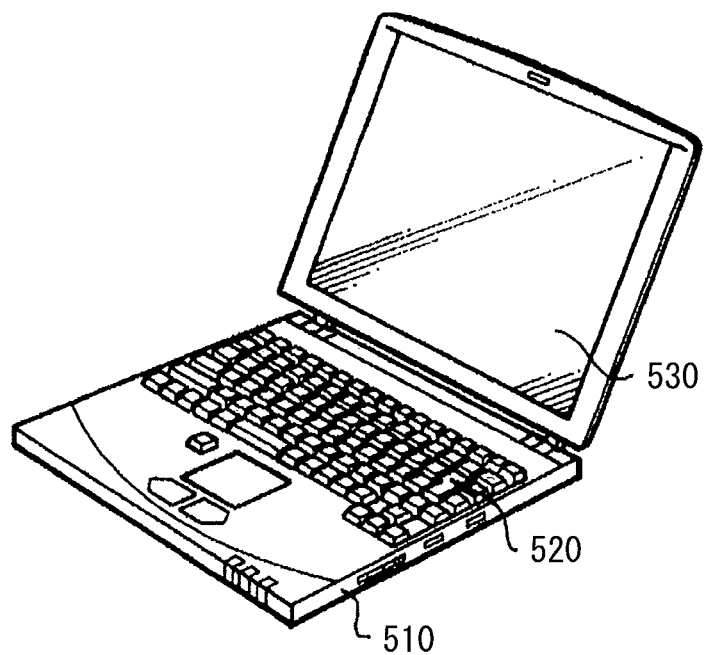
FIG. 10 is a perspective view of a unit in Application Example 3, showing the outer appearance thereof.

FIG. 10 shows the outer appearance of a notebook personal computer to which the display of the embodiments and modification described above is applied. This notebook personal computer is provided with a main body 510, a keyboard 520 for an input operation of text or others, and a display section 530 for image display, for example. The display section 530 is structured by the display according to the embodiments and others described above.

Application Example 4

Figure 11:
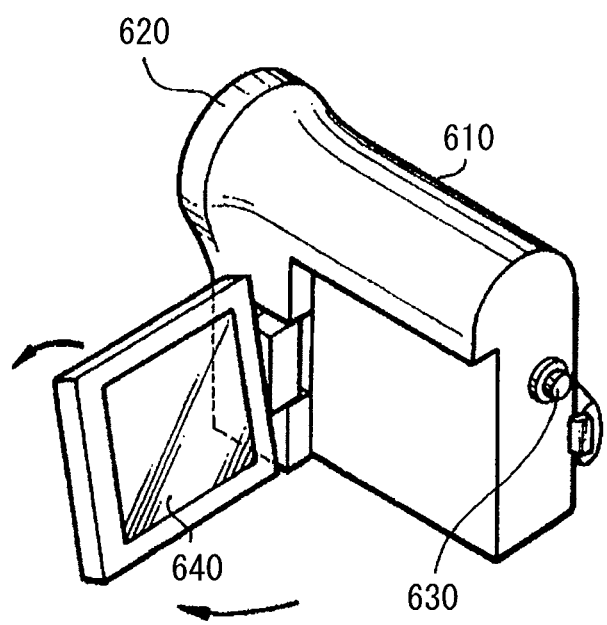
FIG. 11 is a perspective view of a unit in Application Example 4, showing the outer appearance thereof.

FIG. 11 shows the outer appearance of a video camera to which the display of the embodiments and modification described above is applied. This video camera is provided with a main body section 610, a lens for imaging of an object(s) provided on the front side surface of the main body section 610, a start/stop switch 630 at the time of imaging, and a display section 640, for example. The display section 640 is structured by the display according to the embodiments and others described above.

Application Example 5

FIGS. 12A to 12G each show the outer appearance of a mobile phone to which the display of the embodiments and modification described above is applied. This mobile phone is structured by upper and lower chassis 710 and 720 coupled by a coupling section (hinge section) 730, and includes a display 740, a sub display 750, a picture lamp 760, and a camera 770. The display 740 or the sub display 750 is structured by the display according to the embodiments and others described above.

EXAMPLES

Example 1

Described next is examples of the present disclosure. Examples 1-1 to 1-4 below correspond to the first embodiment (the second embodiment, and the modification). In Comparative Example 1-1, the efficiency improving layer 15 is in the single-layer structure, and in Comparative Example 1-2, the layers in the efficiency improving layer 15 are disposed in the order reverse to that in the embodiments and others described above, to be specific, in order of the second layer having a high refractive index, the first layer whose refractive index is lower than that of the second layer, and the third layer. In Comparative Example 1-3, the anode 12 is so structured as to embody the strong cavity effect, and the remaining structure is similar to that of Examples 1-1 to 1-4.

Examples 1-1 to 1-4, and Comparative Examples 1-1 to 1-3

First of all, an ITO layer (with the film thickness of about 20 nm) was formed for use as the first layer 12A of the anode 12 on a substrate 11 being a glass plate of 30 mm×30 mm. Thereafter, a cell for use in a display device was manufactured by masking the layer using an insulation film (not shown) by vapor deposition of $SiO_2$ except a light-emitting region of 2 mm×2 mm. Next, for use as the second layer 12B of the anode 12, a film of NbO was formed with the film thickness of 30 nm. The film was formed by using a DC (Direct Current) sputtering device with the gas composition ratio of (Ar:O=40: 0.3), and the power of 0.5 kW.

Thereafter, the organic layer 13 including the light-emitting layer 13C was formed. First of all, by vapor deposition, a film of HAT-6CN in Chemical Formula 6 was formed for use as the hole injection layer 13A at the deposition speed of 0.2 to 0.4 nm/sec with the film thickness of 8 nm. Next, a film of α-NPD in Chemical Formula 7 was formed for use as the hole transport layer 13B at the deposition speed of 0.2 to 0.4 nm/sec with the film thickness of 35 nm. For use as a host, the light-emitting layer 13C was formed using ADN in Chemical Formula 8 with the film thickness of 30 nm. Herein, a dopant in use was BD-052x (Idemitsu Kosan Co., Ltd). Next, for use as the electron transport layer 13D, a film of ETS007 (Idemitsu Kosan Co., Ltd) was formed by deposition with the film thickness of 90 nm.

[Chemical Formula 6]

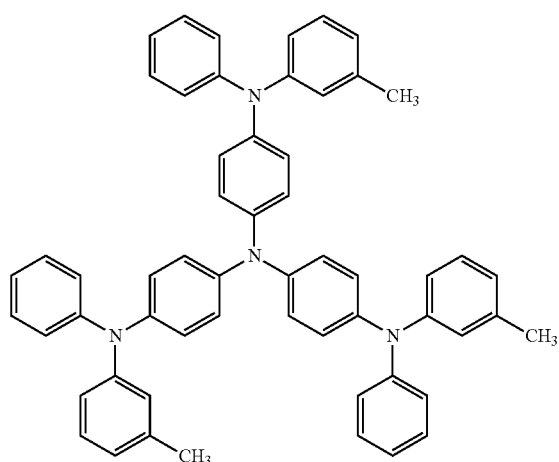

(6)

[Chemical Formula 7]

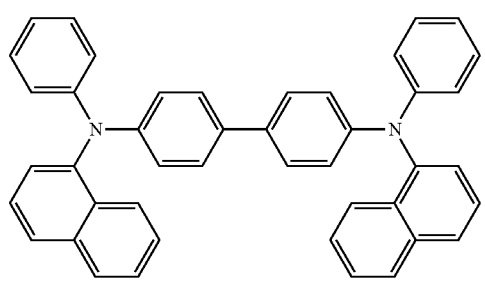

(7)

[Chemical Formula 8]

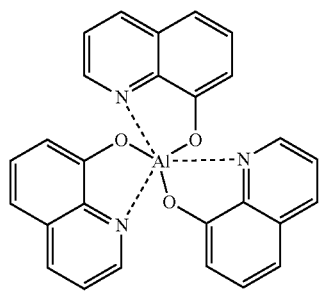

(8)

Formed next was the intermediate electrode 14 that improves the contact property equivalent to a cathode, and ensures the electron injection property. To be specific, formed was a layer of bathocuproin (BCP) and Ca in Chemical Formula 9 with the thickness ratio of 2:1 to have the film thickness of 4 nm.

[Chemical Formula 9]

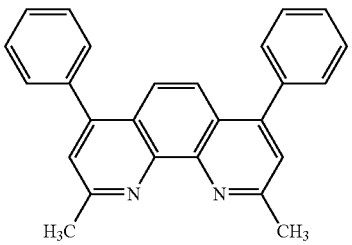

(9)

Next, the efficiency improving layer 15 was formed by vacuum deposition. First of all, a layer of HAT-6CN was formed for use as the first layer 15A at the deposition speed of 0.2 to 0.4 nm/sec with the film thickness of 8 nm, for example. Thereafter, a film of 2TANATA was formed for use as the second layer 15B at the deposition speed of 0.2 to 0.4 nm/sec with the film thickness of 40 nm, for example. A film of HAT-6CN was then formed for use as the third layer 15C at the deposition speed of 0.2 to 0.4 nm/sec with the film thickness of 8 nm, for example.

Lastly, a film of NbO was formed for use as the second layer 16B of the cathode 16 with the film thickness of 30 nm under the condition similar to that for the second layer 12B of the anode 12. Thereafter, for use as the first layer 16A of the cathode 16, a film of IZO was formed by sputtering with the film thickness of 2 μm, thereby manufacturing the display device 10 (20, and 30).

By using the display device 10 (20, and 30) manufactured as described above, the efficiency of light emission on the substrate 11 side (the rear surface side) was measured, and the relative efficiency improvement rate (%) was calculated assuming that the rate in Comparative Example 1 is 100. Table 1 shows the material of the intermediate electrode 14 and that of the efficiency improving layer 15 (the layers 15A to 15C), the refractive index with a wavelength of 460 nm, and the relative efficiency improvement rate (%) in Examples 1-1 to 1-4 and in Comparative Examples 1-1 to 1-3.

TABLE 1

| | Intermediate Electrode | Efficiency Improving Layer | | | | | | Relative Efficiency Improvement Rate (%) |
|---|---|---|---|---|---|---|---|---|
| | | First Layer | | Second Layer | | Third Layer | | |
| | | Material | Refractive Index (460 nm) | Material | Refractive Index (460 nm) | Material | Refractive Index (460 nm) | |
| Example 1-1 | BCP + Ca | HAT-6CN | 1.87 | 2-TNATA | 1.97 | HAT-6CN | 1.87 | 113 |
| Example 1-2 | BCP + Ca | HAT-6CN | 1.87 | α-NPD | 1.94 | HAT-6CN | 1.87 | 114 |
| Example 1-3 | BCP + Ca | HAT-6CN | 1.87 | HTL Material A | 2.02 | HAT-6CN | 1.87 | 113 |
| Example 1-4 | BCP + Ca | HAT-6CN | 1.87 | HTA Material B | 2.01 | HAT-6CN | 1.87 | 114 |
| Comparative Example 1-1 | BCP + Ca | — | — | — | — | HAT-6CN | 1.87 | 100 |

TABLE 1-continued

| | | Efficiency Improving Layer | | | | | | |
|---|---|---|---|---|---|---|---|---|
| | | First Layer | | Second Layer | | Third Layer | | Relative |
| | Intermediate Electrode | Material | Refractive Index (460 nm) | Material | Refractive Index (460 nm) | Material | Refractive Index (460 nm) | Efficiency Improvement Rate (%) |
| Comparative Example 1-2 | BCP + Ca | HAT-6CN | 1.87 | TTPA | 1.78 | HAT-6CN | 1.87 | 95 |
| Comparative Example 1-3 | MgAg (10:1) | HAT-6CN | 1.87 | 2-TNATA | 1.97 | HAT-6CN | 1.87 | 81 |

In comparison with Comparative Example 1-1 in which the anode 13 and the intermediate electrode 14 are each simply made of a material leading to weak cavity, Table 1 shows the improvement of the efficiency of light emission on the rear surface side in Examples 1-1 to 1-4 in which the efficiency conversion layer 15 is provided between the intermediate electrode 14 and the cathode 16. In comparative Example 1-2 in which the layers of the efficiency improving layer 15 are disposed in the order reverse to that in the embodiments, the relative efficiency improvement rate is lower than that in Comparative Example 1-1. This tells that, for improving the efficiency of light extraction to the directions of both surfaces of a transparent display, especially to the direction of the rear surface thereof, an important factor is the order of the layers in the efficiency improving layer 15, in other words, the relative relationship of the refractive index. To be specific, with the layers disposed in order of a refractive-index-low layer, a refractive-index-high layer, and a refractive-index-low layer from the intermediate electrode 14 side, light extraction is performed with a good efficiency to both the front and rear surfaces. Herein, the third layer, that is, the third layer 15C whose refractive index is relatively low is provided for improving the adhesion with the cathode 16. Although not shown, the efficiency of light emission on the rear surface side shows no specific change regardless of with or without the third layer 15C. This means that the structure of including the relatively-low-refractive-index first layer 15A and the relatively-high-refractive-index second layer 15B between the intermediate electrode 14 and the cathode 16 in this order from the intermediate electrode 14 side improves the efficiency of light emission on the rear surface side so that the resulting display device is to be improved in efficiency of light emission with a reduced variation of transmittance in a wavelength range of 450 nm to 700 nm.

Although not shown, in Comparative Examples 1-3, the luminance in one direction, i.e., the luminance on the cathode 16 side (front side), is higher than those in Examples and other Comparative Examples due to the strong cavity effect by MgAg (10:1) in the intermediate electrode 14. However, as shown in Table 1, the luminance in the remaining direction, i.e., on the substrate 11 side (rear surface side) shows the reduction of about 30% compared with that in Example 1, for example. As such, with a display structured by the display devices utilizing the strong cavity effect, the viewability from one direction is extremely poor, and the transmittance is reduced about 50% with an electrode(s) made of a reflective material so that the transparency is lost.

Example 2

Figure 13A:
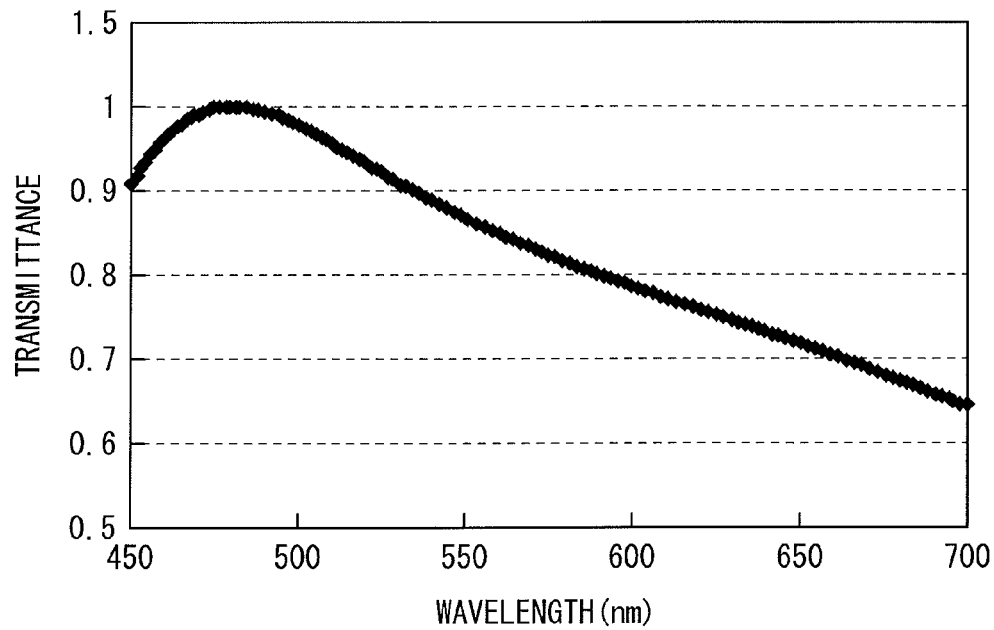
FIGS. 13A and 13B are each a characteristic diagram showing the relationship between wavelength and transmittance in Examples.
Figure 13B:
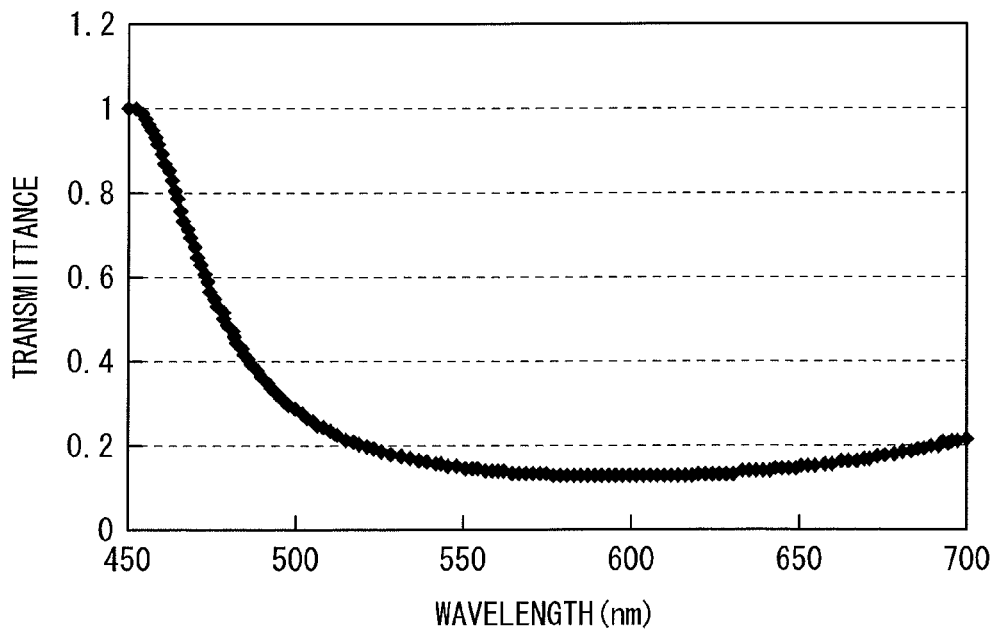
Figure 14A:
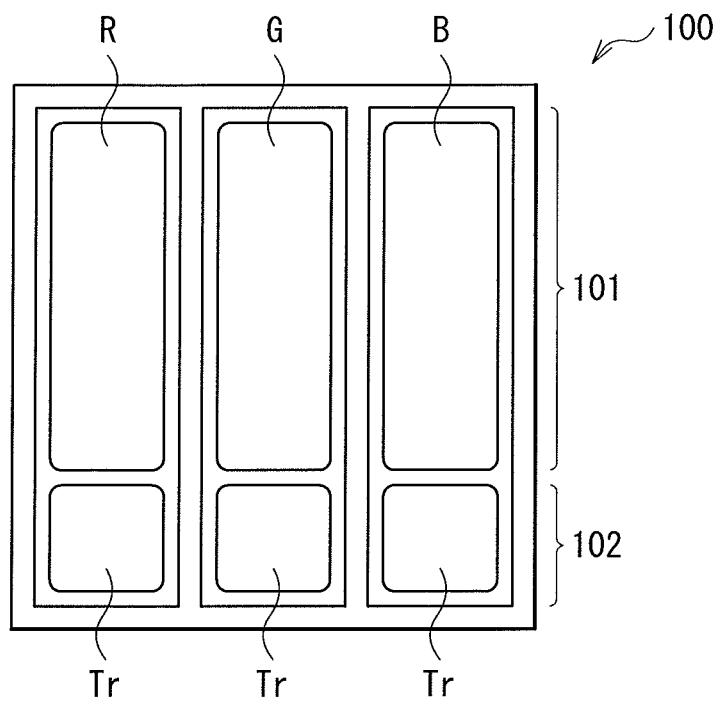
FIGS. 14A and 14B are each a plan view of a previous example, showing the structure thereof.
Figure 14B:
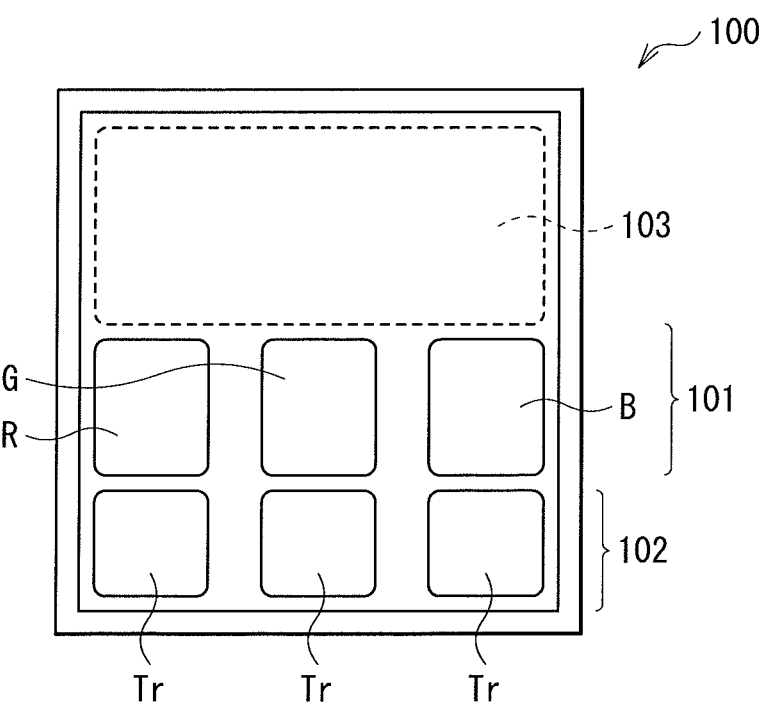

Next, using a display device (Example 1-2 and Comparative Example 1-2) structured similarly to those in Example 1-1 and Comparative Example 1-1 with the film thickness similar thereto, the transmittance in the practical region (visible light region; 450 nm to 700 nm) was measured. FIGS. 13A and 13B are characteristic diagrams respectively showing the measurement result of the transmittance in various wavelengths in Examples 1-2 and Comparative Example 1-2.

FIGS. 13A and 13B show that the extraction rate in the blue light-emitting region is high both in Example 1-2 and Comparative Example 1-2, but the transmittance in the green and red light-emitting regions in Comparative Example 1-2 is extremely low compared with the transmittance in Example 1-2. This tells that structuring the display device as in the embodiments considerably reduces a transmittance difference in various wavelengths compared with the display device in the previous structure. To be specific, the transmittance difference in the wavelength range of 450 nm to 700 nm (the relative ratio between the maximum and minimum transmittance) is about 0.9 in Comparative Example 1-2, but is about 0.35 in Example 1-2, and the relative ratio is improved to be about 0.65. The reason of such a transmittance difference in various wavelengths in Comparative Example 1-2 seems to be no impedance matching in the layers of the efficiency improving layer 15. Therefore, such a structure as in Comparative Example 1-2 with a transmittance difference in wavelengths is not suitable for the green, red, and white light-emitting display devices.

In Examples 1-1 and 1-2, an assessment was made using the display device including a pair of organic layers each including a light-emitting layer (corresponding to the first embodiment). However, also with a display device in the tandem structure as in the second embodiment, i.e., including a plurality of organic layers each including a light-emitting layer, and including a connection layer between the organic layers, the resulting relative efficiency improvement rate is about the same as that in the second embodiment.

While the present technology has been described in detail by referring to the first and second embodiments and the modification, the present technology is not restrictive to the embodiments and others described above, and numerous other modifications may be possibly devised.

In the embodiments described above and others, exemplified is the active matrix display using the TFT substrate. This is not restrictive, and a passive matrix display is also possible. Moreover, the pixel drive circuit for active matrix driving is not restricted to the structure described in the embodiments above, and may additionally have a capacitance device or a transistor if appropriate. If this is the structure, as appropriate to the change of the pixel drive circuit as such, any appropriate drive circuit may be provided additionally to the signal line drive circuit 120 and the scan line drive circuit 130 described above.

Further, the materials and thicknesses of the layers, the film-forming methods and conditions, or others described in the embodiments and others above are not restrictive, and any other materials and thicknesses, or any other film-forming methods will also do. For example, the thicknesses of the layers may arbitrarily take any optically optimum value as appropriate to the entire film thickness in a display device including an organic film, a transparent conductive film, a transparent oxide film, and others.

Also in the embodiments and others described above, the display devices 10R, 10G, 10B, and others are specifically described. However, all of the layers therein are not necessarily provided, or any other layer(s) may be additionally provided. As an example, the light-emitting layer 13C may be formed directly on the hole injection layer 13A without the hole transport layer 13B.

The present technology is also possibly in the following structures.

(1) A display device including one or more organic layers with a light-emitting layer between a first electrode and a second electrode both being transmissive, the display device including:

a third electrode provided on a side of the second electrode opposite to the light-emitting layer; and an efficiency improving layer improving an efficiency of light extraction from the light-emitting layer, and the efficiency improving layer being provided between the second and third electrodes, wherein the first and third electrodes are each in a laminated structure including a first layer being transmissive, and a second layer being transmissive and having a refractive index higher than a refractive index of the first layer.

(2) The display device according to (1), wherein the second layer of the first electrode and the second layer of the third electrode are each provided on the light-emitting layer side.

(3) The display device according to (1) or (2), wherein the second layer of the first electrode and that of the third electrode each contain one or more of niobium oxide, titanium oxide, molybdenum oxide, tantalum oxide, zirconium oxide, vanadium oxide, tungsten oxide, chromium oxide, zinc oxide, and tin oxide.

(4) The display device according to any one of (1) to (3), wherein the second layer of the first electrode and the second layer of the third electrode each contain a mixture of niobium oxide and titanium oxide, a mixture of titanium oxide and zinc oxide, or a mixture of silicon oxide and tin oxide.

(5) The display device according to any one of (1) to (4), wherein the efficiency improving layer is in a two-layer structure including a first layer at least containing an organic material, and a second layer containing the organic material and having a refractive index higher than a refractive index of the first layer.

(6) The display device according to (5), wherein the efficiency improving layer includes the first and second layers in this order from the first electrode side.

(7) The display device according to any one of (1) to (6), wherein a relative rate between a maximum value and a minimum value of a transmittance of light in a wavelength range of 450 nm to 700 nm is 0.5 or higher.

(8) The display device according to any one of (1) to (7), wherein the plurality of light-emitting layers are disposed one on the other via a connection layer.

(9) A display including a plurality of display devices, each of the display devices including:

one or more organic layers with a light-emitting layer between a first electrode and a second electrode both being transmissive;

a third electrode provided on a side of the second electrode opposite to the light-emitting layer; and an efficiency improving layer improving an efficiency of light extraction from the light-emitting layer, and the efficiency improving layer being provided between the second and third electrodes, wherein the first and third electrodes are each in a laminated structure including a first layer being transmissive, and a second layer being transmissive and having a refractive index higher than a refractive index of the first layer.

(10) An electronic unit including a display provided with a plurality of display devices in a display section, each of the display devices including:

one or more organic layers with a light-emitting layer between a first electrode and a second electrode both being transmissive;

a third electrode provided on a side of the second electrode opposite to the light-emitting layer; and an efficiency improving layer improving an efficiency of light extraction from the light-emitting layer, and the efficiency improving layer being provided between the second and third electrodes, wherein the first and third electrodes are each in a laminated structure including a first layer being transmissive, and a second layer being transmissive and having a refractive index higher than a refractive index of the first layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display device, comprising:
a first electrode, wherein the first electrode is a laminated structure that includes at least a first transmissive layer and a second transmissive layer, and wherein a refractive index of the second transmissive layer is higher than a refractive index of the first transmissive layer;
a second electrode;
one or more organic layers with a light-emitting layer between the first electrode and the second electrode:
a third electrode provided on a side of the second electrode opposite to the light-emitting layer, wherein the third electrode is a laminated structure that includes at least a first transmissive layer and a second transmissive layer, and wherein a refractive index of the second transmissive layer is higher than a refractive index of the first transmissive layer; and
an efficiency improving layer improving an efficiency of light extraction from the light-emitting layer, wherein the efficiency improving layer is provided between the second and third electrodes, wherein the efficiency improving layer is a laminated structure that includes a plurality of layers, and wherein a first one of the plurality of layers has a lower refractive index than a second one of the plurality of layers.

2. The display device according to claim 1, wherein
the second layer of the first electrode and the second layer of the third electrode are each provided on the light-emitting layer side.

3. The display device according to claim 1, wherein
the second layer of the first electrode and that of the third electrode each contain one or more of niobium oxide, titanium oxide, molybdenum oxide, tantalum oxide, zirconium oxide, vanadium oxide, tungsten oxide, chromium oxide, zinc oxide, and tin oxide.

4. The display device according to claim 1, wherein
the second layer of the first electrode and the second layer of the third electrode each contain a mixture of niobium oxide and titanium oxide, a mixture of titanium oxide and zinc oxide, or a mixture of silicon oxide and tin oxide.

5. The display device according to claim 1, wherein
the efficiency improving layer is a two-layer structure, wherein the first layer contains an organic material, and wherein the second layer contains the organic material.

6. The display device according to claim 5, wherein
the efficiency improving layer includes the first and second layers in this order from the first electrode side.

7. The display device according to claim 1, wherein
a relative rate between a maximum value and a minimum value of a transmittance of light in a wavelength range of 450 nm to 700 nm is 0.5 or higher.

8. The display device according to claim 1, wherein
the plurality of light-emitting layers are disposed one on the other via a connection layer.

9. A display including a plurality of display devices, each of the display devices comprising:
one or more organic layers with a light-emitting layer between a first electrode and a second electrode both being transmissive;
a third electrode provided on a side of the second electrode opposite to the light-emitting layer; and
an efficiency improving layer improving an efficiency of light extraction from the light-emitting layer, and the efficiency improving layer being provided between the second and third electrodes, wherein
the efficiency improving layer is a laminated structure that includes a plurality of layers, wherein a first one of the plurality of layers has a lower refractive index than a second one of the plurality of layers, and wherein the first and third electrodes are each in a laminated structure including a first layer being transmissive, and a second layer being transmissive and having a refractive index higher than a refractive index of the first layer.

10. The display according to claim 9, wherein the efficiency improving layer is a two-layer structure, and wherein the first layer contains an organic material, and wherein the second layer contains the organic material.

11. The display according to claim 10, wherein
the efficiency improving layer includes the first and second layers in this order from the first electrode side.

12. The display according to claim 9, wherein
a relative rate between a maximum value and a minimum value of a transmittance of light in a wavelength range of 450 nm to 700 nm is 0.5 or higher.

13. The display according to claim 9, wherein
the plurality of light-emitting layers are disposed one on the other via a connection layer.

14. An electronic unit including a display provided with a plurality of display devices in a display section, each of the display devices comprising:
one or more organic layers with a light-emitting layer between a first electrode and a second electrode both being transmissive;
a third electrode provided on a side of the second electrode opposite to the light-emitting layer; and
an efficiency improving layer improving an efficiency of light extraction from the light-emitting layer, and the efficiency improving layer being provided between the second and third electrodes, wherein
the efficiency improving layer is a laminated structure that includes a plurality of layers, wherein a first one of the plurality of layers has a lower refractive index than a second one of the plurality of layers, and wherein the first and third electrodes are each in a laminated structure including a first layer being transmissive, and a second layer being transmissive and having a refractive index higher than a refractive index of the first layer.

15. The electronic unit according to claim 14, wherein the efficiency improving layer is a two-layer structure, wherein the first layer contains an organic material, and wherein the second layer contains the organic material.

16. The electronic unit according to claim 15, wherein
the efficiency improving layer includes the first and second layers in this order from the first electrode side.

17. The electronic unit according to claim 14, wherein
a relative rate between a maximum value and a minimum value of a transmittance of light in a wavelength range of 450 nm to 700 nm is 0.5 or higher.

18. The electronic unit according to claim 14, wherein
the plurality of light-emitting layers are disposed one on the other via a connection layer.

* * * * *